US012591727B2

(12) United States Patent
Seshan et al.

(10) Patent No.: US 12,591,727 B2
(45) Date of Patent: Mar. 31, 2026

(54) LANE REPAIR AND LANE REVERSAL IMPLEMENTATION FOR DIE-TO-DIE (D2D) INTERCONNECTS

(71) Applicant: Intel Corporation, Santa Clara, CA (US)

(72) Inventors: Lakshmipriya Seshan, Sunnyvale, CA (US); Gerald Pasdast, San Jose, CA (US); Peipei Wang, San Jose, CA (US); Narasimha Lanka, Dublin, CA (US); Swadesh Choudhary, Mountain View, CA (US); Zuoguo Wu, San Jose, CA (US); Debendra Das Sharma, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 770 days.

(21) Appl. No.: 17/844,356

(22) Filed: Jun. 20, 2022

(65) Prior Publication Data

US 2022/0327276 A1      Oct. 13, 2022

Related U.S. Application Data

(60) Provisional application No. 63/295,204, filed on Dec. 30, 2021.

(51) Int. Cl.
G06F 30/398      (2020.01)
G06F 30/347      (2020.01)
G06F 30/392      (2020.01)

(52) U.S. Cl.
CPC .......... G06F 30/398 (2020.01); G06F 30/347 (2020.01); G06F 30/392 (2020.01)

(58) Field of Classification Search
CPC ..... G06F 30/398; G06F 30/392; G06F 30/347
(Continued)

(56) References Cited

U.S. PATENT DOCUMENTS 7,936,779 B2      5/2011   Risberg et al.
8,782,321 B2      7/2014   Harriman et al.
(Continued)

FOREIGN PATENT DOCUMENTS

CN       105765544       4/2019
EP        2390969       11/2011
(Continued)

OTHER PUBLICATIONS

Dr. Debendra Das Sharma, Universal Chiplet Interconnect Express (UCIe)®: Building an open chiplet ecosystem, Property of Universal Chiplet Interconnect Express (UCIe) 2022, 7 pgs.
(Continued)

*Primary Examiner* — Suchin Parihar
(74) *Attorney, Agent, or Firm* — Gray Ice Higdon, PLLC

(57)      ABSTRACT

In one embodiment, an apparatus includes a first die comprising: a die-to-die adapter to communicate with protocol layer circuitry and physical layer circuitry, where the die-to-die adapter is to receive first information of a first interconnect protocol; and the physical layer circuitry coupled to the die-to-die adapter. The physical layer circuitry is configured to receive and output the first information to a second die via an interconnect and comprises: a first plurality of transmitters to transmit data via a first plurality of data lanes; and at least one redundant transmitter. The physical layer circuitry may be configured to remap a first data lane of the first plurality of data lanes to the at least one redundant transmitter. Other embodiments are described and claimed.

18 Claims, 21 Drawing Sheets

(58) Field of Classification Search

USPC ........................................................ 716/112

See application file for complete search history.

(56) References Cited

U.S. PATENT DOCUMENTS

| | | | |
|---|---|---|---|
| 8,856,420 | B2 | 10/2014 | Chandra et al. |
| 8,953,644 | B2 | 2/2015 | Chandra et al. |
| 9,164,535 | B2 | 10/2015 | Chandra et al. |
| 9,432,298 | B1 * | 8/2016 | Smith ..................... H01L 25/18 |
| 9,772,970 | B2 | 9/2017 | Luo et al. |
| 9,785,556 | B2 | 10/2017 | Sundararaman et al. |
| 9,804,989 | B2 | 10/2017 | Klein |
| 10,606,785 | B2 | 3/2020 | Das Sharma et al. |
| 10,614,000 | B2 | 4/2020 | Agarwal et al. |
| 10,698,842 | B1 | 6/2020 | Dastidar et al. |
| 10,817,462 | B1 | 10/2020 | Dastidar et al. |
| 10,848,595 | B2 | 11/2020 | Song et al. |
| 11,030,126 | B2 | 6/2021 | Koufaty et al. |
| 11,036,650 | B2 | 6/2021 | Agarwal |
| 11,194,505 | B2 | 12/2021 | Lee et al. |
| 11,201,838 | B2 | 12/2021 | Marolia et al. |
| 11,232,058 | B2 | 1/2022 | Jen et al. |
| 2011/0179212 | A1 | 7/2011 | Hartman |
| 2013/0262948 | A1 | 10/2013 | Takehara |
| 2014/0114928 | A1 | 4/2014 | Beers |
| 2014/0372663 | A1 | 12/2014 | Chandra et al. |
| 2015/0032917 | A1 | 1/2015 | Nguyen |
| 2015/0089110 | A1 | 3/2015 | Harriman et al. |
| 2018/0025789 | A1 | 1/2018 | Dono et al. |
| 2018/0109446 | A1 | 4/2018 | Srinivasan et al. |
| 2018/0276164 | A1 * | 9/2018 | Das Sharma ....... H01L 25/0655 |
| 2018/0300275 | A1 | 10/2018 | Wu et al. |
| 2019/0004990 | A1 | 1/2019 | Van Doren et al. |
| 2019/0095215 | A1 | 3/2019 | Teoh et al. |
| 2019/0238179 | A1 * | 8/2019 | Iyer ......................... H04B 3/40 |
| 2020/0042471 | A1 | 2/2020 | Kerr et al. |
| 2020/0044895 | A1 | 2/2020 | Mittal et al. |
| 2020/0278733 | A1 | 9/2020 | Li et al. |
| 2020/0356436 | A1 | 11/2020 | Iyer et al. |
| 2020/0394148 | A1 | 12/2020 | Regan et al. |
| 2020/0394150 | A1 | 12/2020 | Lanka et al. |
| 2021/0097015 | A1 | 4/2021 | Das Sharma et al. |
| 2021/0224156 | A1 | 7/2021 | Cho et al. |
| 2021/0399982 | A1 | 12/2021 | Das Sharma et al. |
| 2022/0222198 | A1 | 7/2022 | Lanka et al. |
| 2022/0237138 | A1 | 7/2022 | Lanka et al. |
| 2022/0318111 | A1 | 10/2022 | Choudhary et al. |
| 2022/0327083 | A1 | 10/2022 | Das Sharma et al. |
| 2022/0327276 | A1 | 10/2022 | Seshan et al. |
| 2024/0213985 | A1 * | 6/2024 | Zaliznyak ........... H01L 23/5382 |
| 2025/0021504 | A1 * | 1/2025 | Doddi ................. G06F 13/4018 |
| 2025/0086132 | A1 * | 3/2025 | Srivastava .......... G06F 13/4068 |
| 2025/0181491 | A1 * | 6/2025 | Smith ..................... G06F 3/065 |

FOREIGN PATENT DOCUMENTS

| | | |
|---|---|---|
| EP | 3037972 | 6/2016 |
| WO | 2015099719 | 7/2015 |
| WO | 2019009970 | 1/2019 |

OTHER PUBLICATIONS

Universal Chiplet Interconnect Express (UCIe), Universal Chiplet Interconnect Express (UCIe) Specification Revision 1.0, Feb. 24, 2022, 288 pgs.

U.S. Appl. No. 17/844,348, filed Jun. 20, 2022, entitled "Compliance and Debug Methods for Die-To-Die (D2D) Interconnects," by Debendra Das Sharma, et al., 43 pgs.

U.S. Appl. No. 17/708,367, filed Mar. 30, 2022, entitled "Sideband Interface for Die-To-Die Interconnects," by Narasimha Lanka, et al., 49 pgs.

U.S. Appl. No. 17/708,386, filed Mar. 30, 2022, entitled "Link Initialization Training and Bring up for Die-To-Die Interconnect," by Narasimha Lanka, et al., 46 pgs.

U.S. Appl. No. 17/844,366, filed Jun. 20, 2022, entitled "Standard Interfaces for Die To Die (D2D) Interconnect Stacks," by Swadesh Choudhary, et al., 44 pgs.

International Searching Authority, International Search Report and Written Opinion dated Mar. 13, 2023 In International Application No. PCT/US2022/049772 (12 pages).

International Searching Authority, International Search Report and Written Opinion dated Apr. 4, 2023 in International Application No. PCT/US2022/050653 (13 pages).

International Searching Authority, International Search Report and Written Opinion dated Apr. 5, 2023 in International Application No. PCT/US2022/050656 (13 pages).

International Searching Authority, International Search Report and Written Opinion dated Apr. 7, 2023 in International Application No. PCT/US2022/050657 (11 pages).

International Searching Authority, International Search Report and Written Opinion dated Apr. 14, 2023 in International Application No. PCT/US2022/050655 (11 pages).

* cited by examiner

300

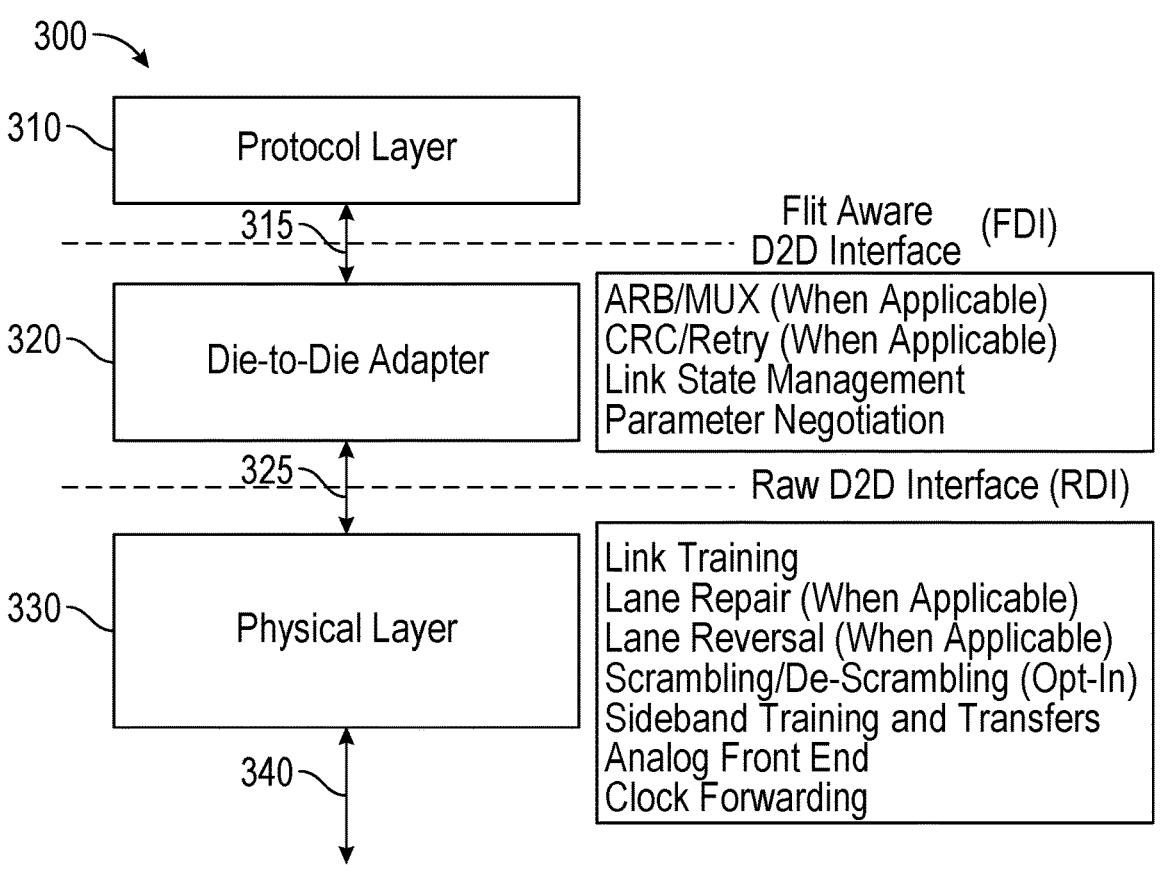

310 — Protocol Layer

315 —

Flit Aware
D2D Interface (FDI)

320 — Die-to-Die Adapter

ARB/MUX (When Applicable)
CRC/Retry (When Applicable)
Link State Management
Parameter Negotiation

325 —

Raw D2D Interface (RDI)

330 — Physical Layer

Link Training
Lane Repair (When Applicable)
Lane Reversal (When Applicable)
Scrambling/De-Scrambling (Opt-In)
Sideband Training and Transfers
Analog Front End
Clock Forwarding

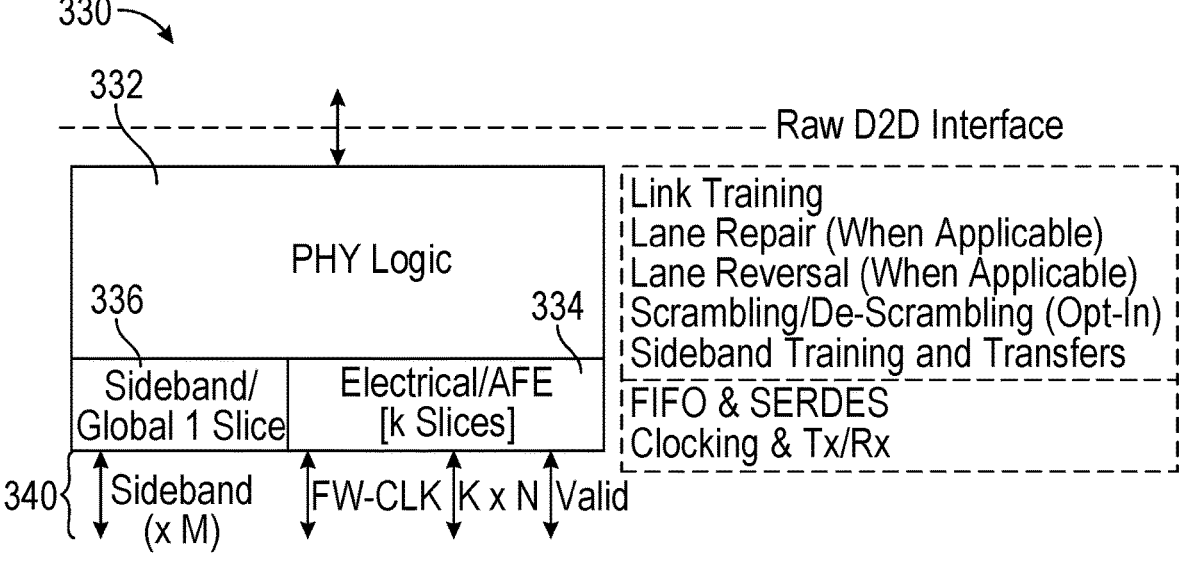

332

Raw D2D Interface

PHY Logic 336                    334

Sideband/
Global 1 Slice

Electrical/AFE
[k Slices]

Link Training
Lane Repair (When Applicable)
Lane Reversal (When Applicable)
Scrambling/De-Scrambling (Opt-In)
Sideband Training and Transfers FIFO & SERDES
Clocking & Tx/Rx 340 { Sideband
(x M)        FW-CLK  K x N  Valid

Die-1

434     432

R_DR     R_CR     R_C     R_D

Side
Band (x4)     T_DR     T_CR     T_C     T_D

430

Rx     Main Band (x64)     420

Tx     Main Band (x64)     425

440

Tx     Main Band (x64)     460

Rx     Main Band (x64)     465

470

T_DR     T_CR     T_C     T_D

R_DR     R_CR     R_C     R_D

Side Band (x4)

474     472

Die-2

450

900

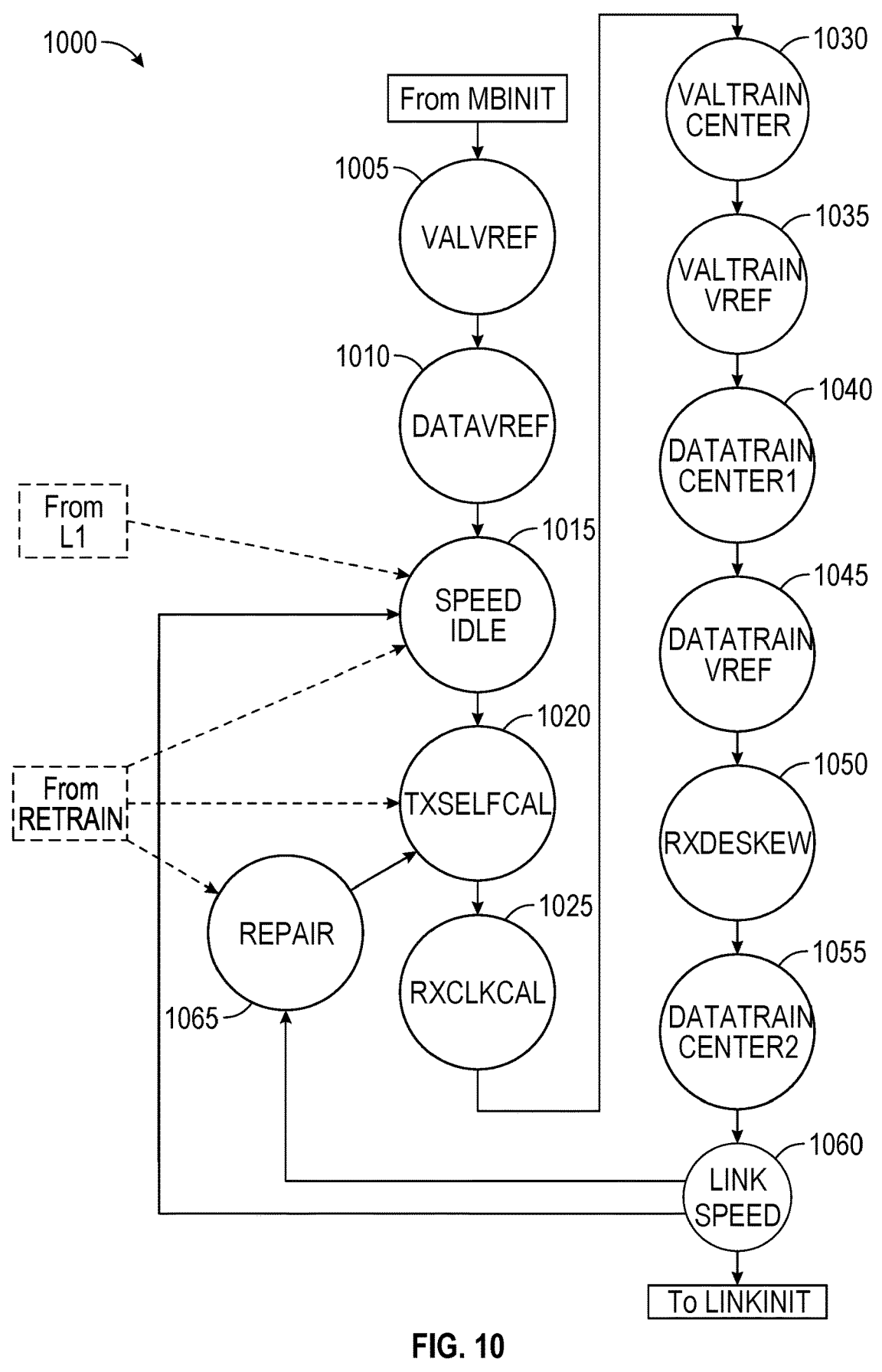

1000

From MBINIT

1005 — VALVREF

1010 — DATAVREF

From L1

1015 — SPEED IDLE

From RETRAIN

1020 — TXSELFCAL

REPAIR

1065

1025 — RXCLKCAL

1030 — VALTRAIN CENTER

1035 — VALTRAIN VREF

1040 — DATATRAIN CENTER1

1045 — DATATRAIN VREF

1050 — RXDESKEW

1055 — DATATRAIN CENTER2

1060 — LINK SPEED

To LINKINIT

FIG. 10

LANE REPAIR AND LANE REVERSAL IMPLEMENTATION FOR DIE-TO-DIE (D2D) INTERCONNECTS

CROSS-REFERENCE TO RELATED APPLICATION

This application claims the benefit of U.S. Provisional Application No. 63/295,204, filed on Dec. 30, 2021, in the name of Lakshmipriya Seshan, Gerald Pasdast, Peipei Wang, Narasimha Lanka, Swadesh Choudhary, Zuoguo Wu and Debendra Das Sharma, entitled "LANE REPAIR AND LANE REVERSAL IMPLEMENTATION FOR DIE-TO-DIE (D2D) INTERCONNECTS."

BACKGROUND

As chiplets are integrated with advanced package technology, high yields can keep design cost low. However any single bump connectivity failure in a fabricated die could result in discarding an entire packaged part, leading to waste and cost concerns.

BRIEF DESCRIPTION OF THE DRAWINGS

FIGS. 3A/3B is a block diagram of a layered protocol that may implement one or more embodiments.

FIG. 10 is a flow diagram of a main band training in accordance with an embodiment.

DETAILED DESCRIPTION

Figure 1:
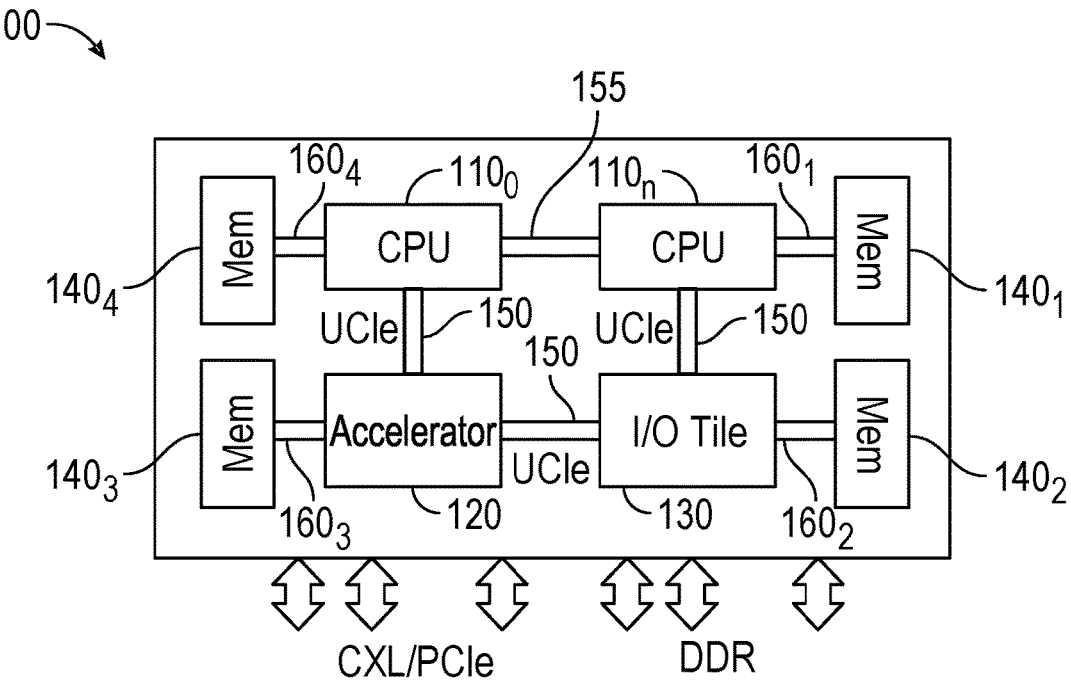
FIG. 1 is a block diagram of a package in accordance with an embodiment.

In various embodiments, one or more dies implemented in a semiconductor package may include redundancy hardware circuitry to provide recovery schemes to improve the yield of packaged parts using advanced interconnect technology. In implementations, the distribution of redundant bumps and other redundant circuitry and corresponding recovery mechanisms within a physical layer can be carefully designed to obtain maximum coverage with minimum overhead. Embodiments also provide an ability to perform lane remapping and/or lane reversal between transmit and receive lanes if they are not connected in a bit lane-matched manner, e.g., due to floorplan constraints.

Embodiments realize a very general means to solve all types of lane remapping issues like repair, remapping, etc., with minimal overhead to bump area and performance. To this end, redundant lanes may be provided at a start and an end of each module with full flexibility to shift per lane data forward and backward independently at transmit and receive sides. Full utilization of redundant lanes may be used to repair and recover any type of bump connectivity issues.

In various embodiments, a multi-protocol capable, on-package interconnect may be used to communicate between disaggregated dies of a package. This interconnect can be initialized and trained by an ordered bring up flow to enable independent reset of the different dies, detection of partner dies' reset exit, and an ordered initialization and training of sideband and mainband interfaces of the interconnect (in that order). More specifically, a sideband initialization may be performed to detect that a link partner die has exited reset and to initialize and train the sideband. Thereafter the mainband may be initialized and trained, which may include any lane reversal and/or repair operations as described further herein. Such mainband operations may leverage the already brought up sideband to communicate synchronization and status information.

With embodiments that perform lane reversal and/or repair, yield loss due to lane connectivity issues for advanced package multi-chip packages (MCPs) can be recovered. Further, by way of lane repair techniques in accordance with an embodiment, both left and right shift techniques may cover an entire bump map for efficient lane repair. Still further lane reversal detection may enable die rotation and die mirroring to enable multiple on-package instantiations with the same die. In this way, lane reversal may eliminate multiple tape-ins of the same die.

Embodiments may be implemented in connection with a multi-protocol capable, on-package interconnect protocol that may be used to connect multiple chiplets or dies on a single package. With this interconnect protocol, a vibrant ecosystem of disaggregated die architectures can be interconnected together. This on-package interconnect protocol may be referred to as a "Universal Chiplet Interconnect express" (UCIe) interconnect protocol, which may be in accordance with a UCIe specification as may be issued by a special interest group (SIG) or other promotor, or other entity. While termed herein as "UCIe," understand that the multi-protocol capable, on-package interconnect protocol may adopt another nomenclature.

This UCIe interconnect protocol may support multiple underlying interconnect protocols, including flit-based modes of certain communication protocols. In one or more embodiments, the UCIe interconnect protocol may support: a flit mode of a Compute Express Limited (CXL) protocol such as in accordance with a given version of a CXL specification such as the CXL Specification version 2.0 (published November 2020), any future update, version or variation thereof; a Peripheral Component Interconnect express (PCIe) flit mode such as in accordance with a given version of a PCIe specification such as the PCIe Base Specification version 6.0 (published 2022) or any future update, version or variation thereof; and a raw (or streaming) mode that be used to map any protocol supported by link partners. Note that in one or more embodiments, the UCIe interconnect protocol may not be backwards-compatible, and instead may accommodate current and future versions of the above-described protocols or other protocols that support flit modes of communication.

Embodiments may be used to provide compute, memory, storage, and connectivity across an entire compute continuum, spanning cloud, edge, enterprise, 5G, automotive, high-performance computing, and hand-held segments. Embodiments may be used to package or otherwise couple dies from different sources, including different fabs, different designs, and different packaging technologies.

Chiplet integration on package also enables a customer to make different trade-offs for different market segments by choosing different numbers and types of dies. For example, one can choose different numbers of compute, memory, and I/O dies depending on segment. As such, there is no need for a different die design for different segments, resulting in lower product stock keeping unit (SKU) costs.

Referring now to FIG. 1, shown is a block diagram of a package in accordance with an embodiment. As shown in FIG. 1, package 100 may be any type of integrated circuit package. In the particular illustration shown, package 100 includes multiple chiplets or dies, including central processing unit (CPU) dies $110_{0-n}$, an accelerator die 120, an input/output (I/O) tile 130, and memory $140_{1-4}$. At least certain of these dies may be coupled together via on-package interconnects in accordance with an embodiment. As shown, interconnects $150_{1-3}$ may be implemented as UCIe interconnects. CPUs 110 may couple via another on-package interconnect 155 which, in some cases, may provide CPU-to-CPU connectivity on-package using a UCIe interconnect that runs a coherency protocol. As one such example, this coherency protocol may be an Intel® Ultra Path Interconnect (UPI); of course other examples are possible.

While the protocols mapped to the UCIe protocol discussed herein include PCIe and CXL, understand embodiments are not limited in this regard. In example embodiments, mappings for any underlying protocols may be done using a flit format, including the raw mode. In an implementation, these protocol mappings may enable more on-package integration by replacing certain physical layer circuitry (e.g., a PCIe SERDES PHY and PCIe/CXL LogPHY along with link level retry) with a UCIe die-to-die adapter and PHY in accordance with an embodiment to improve power and performance characteristics. In addition, the raw mode may be protocol-agnostic to enable other protocols to be mapped, while allowing usages such as integrating a stand-alone SERDES/transceiver tile (e.g., ethernet) on-package. As further shown in FIG. 1, off-package interconnects may be in accordance with various protocols, including CXL/PCIe protocols, double data rate (DDR) memory interconnect protocols and so forth.

In an example implementation, accelerator 120 and/or I/O tile 130 can be connected to CPU(s) 110 using CXL transactions running on UCIe interconnects 150, leveraging the I/O, coherency, and memory protocols of CXL. In the embodiment of FIG. 1, I/O tile 130 can provide an interface to external CXL, PCIe and DDR pins of the package. Statically or dynamically, accelerator 120 can also be connected to CPUs 110 using PCIe transactions running on UCIe interconnects 150.

Packages in accordance with an embodiment may be implemented in many different types of computing devices, ranging from small portable devices such as smartphones and so forth, up to larger devices including client computing devices and server or other datacenter computing devices. In this way, UCIe interconnects may enable local connectivity and long-reach connectivity at rack/pod levels. Although not shown in FIG. 1, understand that at least one UCIe retimer may be used to extend the UCIe connectivity beyond the package using an off-package interconnect. Examples of off-package interconnects include electrical cables, optical cables or any other technology to connect packages at a rack/pod level.

Embodiments may further be used to support a rack/pod-level disaggregation using a CXL 2.0 (or later) protocol. In such arrangement, multiple compute nodes (e.g., a virtual hierarchy) from different compute chassis couple to a CXL switch that can couple to multiple CXL accelerators/Type-3 memory devices, which can be placed in one or more separate drawers. Each compute drawer may couple to the switch using an off-package Interconnect running a CXL protocol through a UCIe retimer.

Figure 2A:
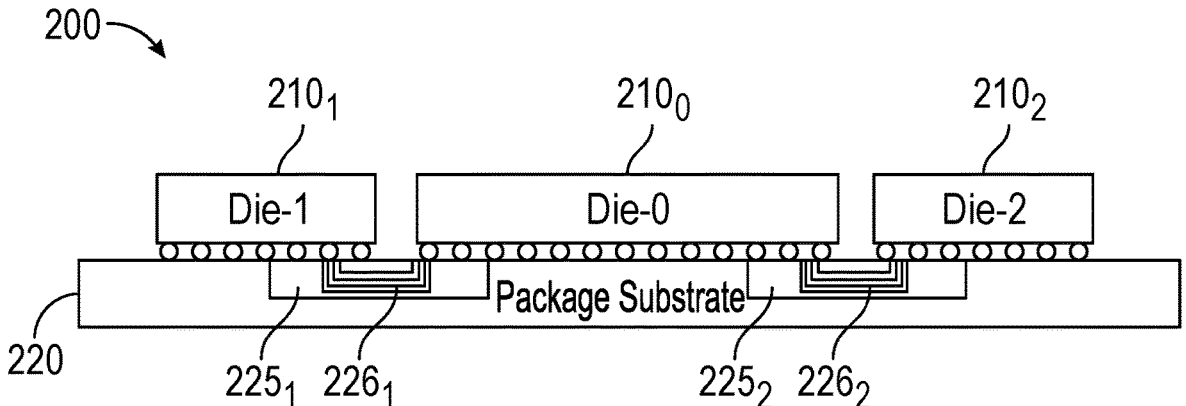
FIGS. 2A-2D are cross-sectional views of different packaging options incorporating embodiments.

Referring now to FIGS. 2A-2D, shown are cross-sectional views of different packaging options incorporating embodiments. As illustrated in FIG. 2A, package 200 may be an advanced package that provides advanced packaging technology. In one or more embodiments, an advanced package implementation may be used for performance optimized applications, including power-efficient performance applications. In some such example use cases, a channel reach may be short (e.g., less than 2 mm) and the interconnect can be optimized for high bandwidth and low latency with best performance and power efficiency characteristics.

As illustrated in FIG. 2A, package 200 includes a plurality of die $210_{0-2}$. Understand while three specific die are shown in FIG. 2A, many more die may be present in other implementations. Die 210 are adapted on a package substrate 220. In one or more embodiments, die 210 may be adapted to substrate 220 via bumps. As illustrated, package substrate 220 includes a plurality of silicon bridges $225_{1-2}$ that include on-package interconnects $226_{1-2}$. Interconnects 226 may be implemented as UCIe interconnects, and silicon bridges 225 may be implemented as Intel® EMIB bridges, in an embodiment.

Figure 2B:
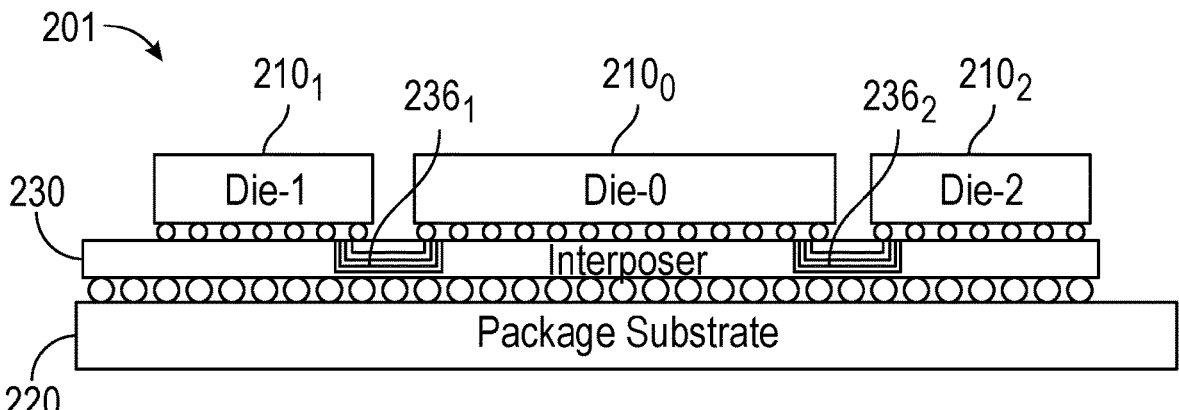

Referring now to FIG. 2B, shown is another embodiment of an advanced package, in which a package configuration is implemented as a Chip on Wafer on Substrate (CoWoS). In this illustration, package 201 includes die 210 that are adapted on an interposer 230, where this interposer includes corresponding on-package interconnects 236. In turn, interposer 230 adapts to package substrate 220 via bumps.

Figure 2C:
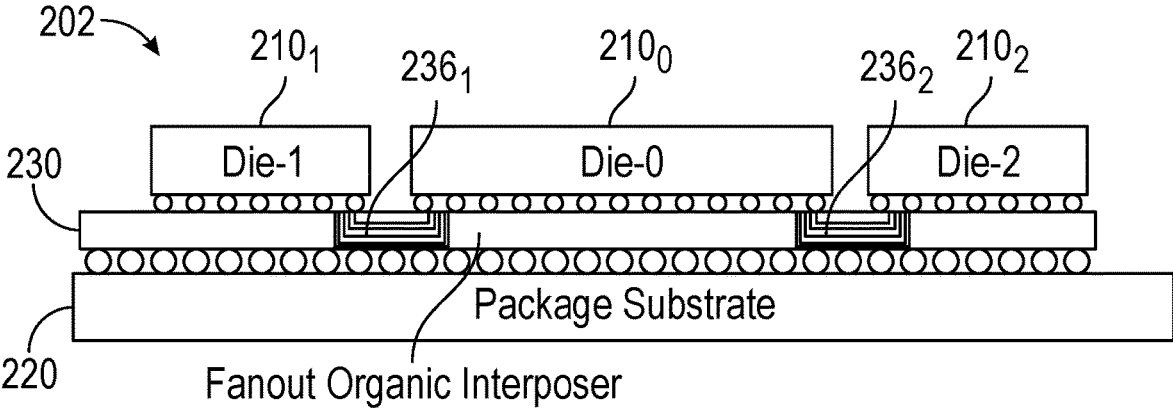

Referring now to FIG. 2C, shown is another embodiment of an advanced package, in which a package configuration is implemented with a fanout organic interposer 230. In this illustration, package 202 includes die 210 that are adapted on interposer 230 including corresponding on-package interconnects 236. In turn, interposer 230 adapts to package substrate 220 via bumps.

Figure 2D:
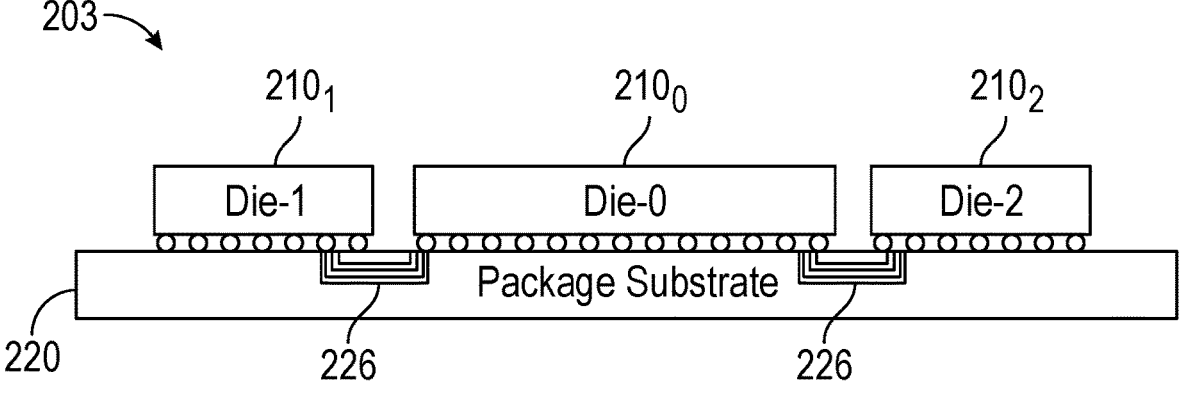

Referring now to FIG. 2D, shown is another package illustration. Package 203 may be a standard package that provides standard packaging technology. In one or more embodiments, a standard package implementations may be used for low cost and long reach (e.g., 10 mm to 25 mm) interconnects using traces on organic package/substrate, while still providing significantly better BER characteristics compared to an off-package SERDES. In this implementation, package 203 includes die 210 adapted to package substrate 220 where on-package interconnects 226 are adapted within package substrate 220 directly, without inclusion of silicon bridges or so forth.

Referring now to FIGS. 3A/3B, shown is a block diagram of a layered protocol that may implement one or more embodiments. As illustrated in the high level of FIG. 3A, multiple layers of a layered protocol implemented in a circuit 300 may implement an interconnect protocol. A protocol layer 310 may communicate information of one or more application-specific protocols. Protocol layer 310 may operate, in one or more implementations, according to one or more of a PCIe or CXL flit mode, and/or a streaming protocol to offer generic modes for a user-defined protocol to be transmitted. For each protocol, different optimizations and associated flit transfers are available.

In turn, protocol layer 310 couples to a die-to-die adapter (D2D) adapter 320 via an interface 315. In an embodiment, interface 315 may be implemented as a flit-aware D2D interface (FDI). In an embodiment, D2D adapter 320 may be configured to coordinate with protocol layer 310 and a physical layer 330 to ensure successful data transfer across a UCIe link 340. Adapter 320 may be configured to minimize logic on the main data path as much as possible, giving a low latency, optimized data path for protocol flits.

FIG. 3A illustrates various functionality performed within D2D adapter 320. D2D adapter 320 may provide link state management and parameter negotiation for connected dies (also referred to as "chiplets"). Still further D2D adapter 320 may optionally guarantee reliable delivery of data through cyclic redundancy check (CRC) and link level retry mechanism, e.g., where a raw BER is less than 1e-27. When multiple protocols are supported, D2D adapter 320 may define the underlying arbitration mechanism. For example, when transporting communications of a CXL protocol, adapter 320 may provide arbitrator/multiplexer (ARB/MUX) functionality that supports communications of multiple simultaneous protocols. In one or more embodiments a flow control unit (flit) of a given size, e.g., 256 bytes, may define the underlying transfer mechanism when D2D adapter 320 is responsible for reliable transfer.

When operation is in a flit mode, die-to-die adapter 320 may insert and check CRC information. In contrast, when operation is in a raw mode, all information (e.g., bytes) of a flit are populated by protocol layer 310. If applicable, adapter 320 may also perform retry. Adapter 320 may further be configured to coordinate higher level link state machine management and bring up, protocol options related parameter exchanges with a remote link partner, and when supported, power management coordination with the remote link partner. Different underlying protocols may be used depending on usage model. For example, in an embodiment data transfer using direct memory access, software discovery, and/or error handling, etc. may be handled using PCIe/CXL.io; memory use cases may be handled through CXL.Mem; and caching requirements for applications such as accelerators can be handled using CXL.cache.

In turn, D2D adapter 320 couples to physical layer 330 via an interface 325. In an embodiment, interface 325 may be a raw D2D interface (RDI). As illustrated in FIG. 3B, physical layer 330 includes circuitry to interface with die-to-die interconnect 340 (which in an embodiment may be a UCIe interconnect or another multi-protocol capable on-package interconnect). In one or more embodiments, physical layer 330 may be responsible for the electrical signaling, clocking, link training, sideband, etc.

Interconnect 340 may include sideband and mainband links, which may be in the form of so-called "lanes," which are physical circuitry to carry signaling. In an embodiment, a lane may constitute circuitry to carry a pair of signals mapped to physical bumps or other conductive elements, one for transmission, and one for reception. In an embodiment, a xN UCIe link is composed of N lanes.

As illustrated in FIG. 3B, physical layer 330 includes three sub-components, namely a physical (PHY) logic 332, an electrical/analog front end (AFE) 334, and a sideband circuitry 336. In an embodiment, interconnect 340 includes a main band interface that provides a main data path on the physical bumps can be organized as a group of lanes called a Module or a Cluster.

The unit of construction of interconnect 340 is referred to herein equally as a "cluster" or "module." In an embodiment, a cluster may include N single-ended, unidirectional, full-duplex data lanes, one single-ended lane for Valid, one lane for tracking, a differential forwarded clock per direction, and 2 lanes per direction for sideband (single-ended clock and data). Thus a Module (or Cluster) forms the atomic granularity for the structural design implementation of AFE 334. There may be different numbers of lanes provided per Module for standard and advanced packages. For example, for a standard package 16 lanes constitute a single Module, while for an advanced package 64 lanes constitute a single Module. Although embodiments are not limited in this regard, interconnect 340 is a physical interconnect that may be implemented using one or more of conductive traces, conductive pads, bumps and so forth that provides for interconnection between PHY circuitry present on link partner dies.

A given instance of protocol layer 310 or D2D adapter 320 can send data over multiple Modules where bandwidth scaling is implemented. The physical link of interconnect 340 between dies may include two separate connections: (1) a sideband connection; and (2) a main band connection. In embodiments, the sideband connection is used for parameter exchanges, register accesses for debug/compliance and coordination with remote partner for link training and management.

In one or more embodiments, a sideband interface is formed of at least one data lane and at least one clock lane in each direction. Stated another way, a sideband interface is a two-signal interface for transmit and receive directions. In an advanced package usage, redundancy may be provided with an additional data and clock pair in each direction for repair or increased bandwidth. The sideband interface may include a forwarded clock pin and a data pin in each direction. In one or more embodiments, a sideband clock signal may be generated by an auxiliary clock source configured to operate at 800 MHz regardless of main data path speed. Sideband circuitry 336 of physical layer 330 may be provided with auxiliary power and be included in an always on domain. In an embodiment, sideband data may be communicated at a 800 megatransfers per second (MT/s) single data rate signal (SDR). The sideband may be configured to run on a power supply and auxiliary clock source which are always on. Each Module has its own set of sideband pins.

The main band interface, which constitutes the main data path, may include a forwarded clock, a data valid pin, and N lanes of data per Module. For an advanced package option, N=64 (also referred to as x64) and overall four extra pins for lane repair are provided in a bump map. For a standard package option, N=16 (also referred to as x16) and no extra pins for repair are provided. Physical layer 330 may be configured to coordinate the different functions and their relative sequencing for proper link bring up and management (for example, sideband transfers, main-band training and repair etc.).

In one or more embodiments, advanced package implementations may support redundant lanes (also referred to herein as "spare" lanes) to handle faulty lanes (including clock, valid, sideband, etc.). In one or more embodiments, standard package implementations may support lane width degradation to handle failures. In some embodiments, multiple clusters can be aggregated to deliver more performance per link.

Figure 4A:
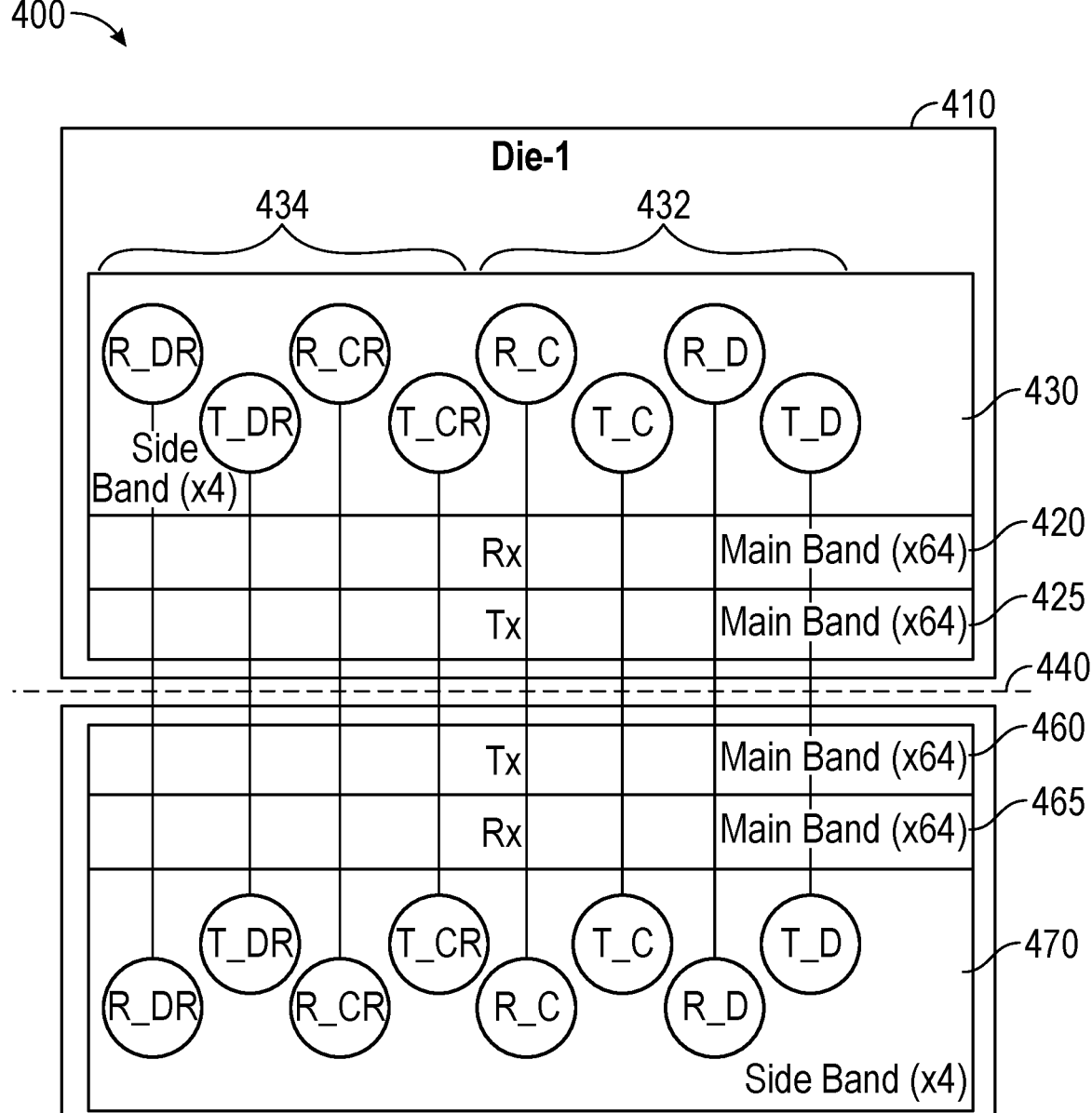
FIGS. 4A-4B are block diagrams of multi-die packages in accordance with various embodiments.

Referring now to FIG. 4A, shown is a block diagram of a multi-die package in accordance with an embodiment. As shown in FIG. 4A, package 400 includes at least a first die 410 and a second die 450. Understand that dies 410 and 450 may be various types of die including CPUs, accelerators, I/O devices or so forth. In the high level view shown in FIG. 4A, an interconnect 440 that couples the die together is illustrated as a dashed line. Interconnect 440 may be an instantiation of an on-package multi-protocol capable interconnect, e.g., a UCIe interconnect as described herein. While not shown in detail in FIG. 4A, understand that interconnect 440 may be implemented using conductive bumps adapted on each die, which may couple together to provide interconnection between the die. In addition, interconnect 440 further may include in-package circuitry such as conductive lines on or within one or more substrates. As used herein, understand that the term "lanes" refers to any and all interconnect circuitry that couples one die to another die.

In a particular embodiment, interconnect 440 may be a UCIe interconnect having one or more modules, where each module includes a sideband interface and a main band interface. In this high level view, the main band interface couples to main band receiver and transmitter circuitry within each die. Specifically, die 410 includes main band receiver circuitry 420 and main band transmitter circuitry 425, while in turn die 450 includes main band receiver circuitry 465 and main band transmitter circuitry 460.

FIG. 4A further shows connectivity for the sideband interface. In general, a sideband includes a data lane and a clock lane in each direction, and in an advanced package usage, redundancy may be provided with an additional data and clock pair in each direction. Thus FIG. 4A shows a first possible connectivity implementation between the sideband circuitry of the two die. Die 410 includes a sideband circuit 430 including first sideband circuitry 432 that includes corresponding sideband clock and data receivers (R_C and R_D) and sideband clock and data transmitters (T_C and T_D) that couple to corresponding sideband transmitter and receiver circuitry of a sideband circuitry 470 of second die 450, respectively. Sideband circuit 430 also includes second sideband circuitry 434 having similar circuitry for redundant sideband clock and data transmitters and receivers (enumerated as above, with an "R" terminating the transmitter and receiver abbreviations).

In FIG. 4A, a first sideband connectivity instantiation is illustrated, where sideband circuitry 432 and 472 act as a functional sideband, and sideband circuitry 434 and 474 acts as a redundant sideband.

Figure 4B:
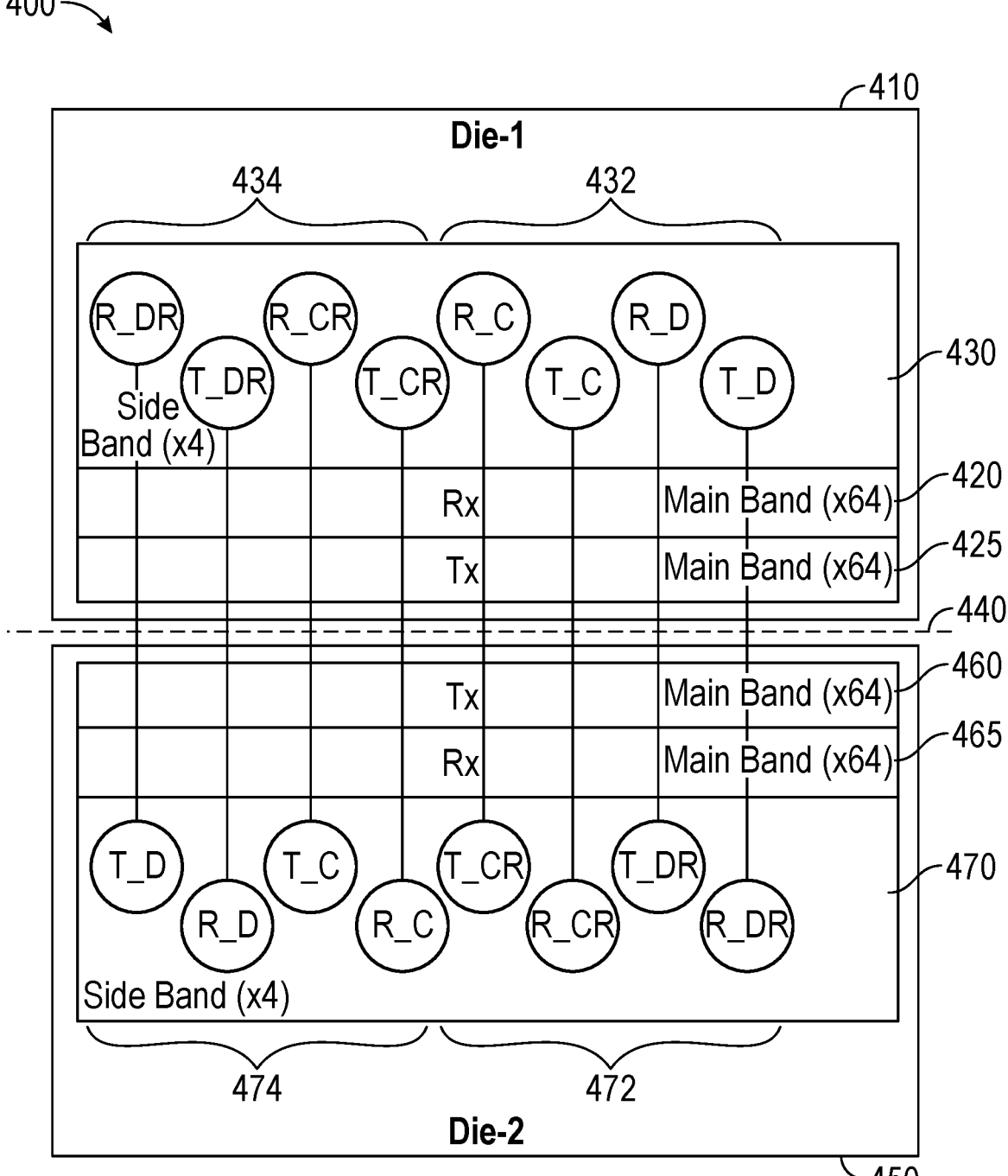

Depending upon a sideband detection that is performed during a sideband initialization, it may be determined that one or more of the sideband lanes and/or associated sideband circuitry is defective and thus at least a portion of redundant sideband circuitry can be used as part of a functional sideband. More specifically FIG. 4B shows a second possible connectivity implementation between the sideband circuitry of the two die. In this example, redundant sideband data transmitter and receiver are present in sideband circuitry 472 to act as part of the functional sideband.

In different implementations, an initialization and bring up flow may allow for any connectivity as long as data-to-data and clock-to-clock connectivity is maintained. If no redundancy is required based on such initialization, both sideband circuit pairs can be used to extend sideband bandwidth, enabling faster message exchanges. Note that while FIGS. 4A and 4B are shown in the context of an advanced package configuration, similar sideband circuitry may be present on die used in a standard package. However in certain implementations, redundant sideband circuitry and redundant sideband lanes may not be present in a standard package, as a standard package may not provide for redundancy and lane repair support.

Figure 5:
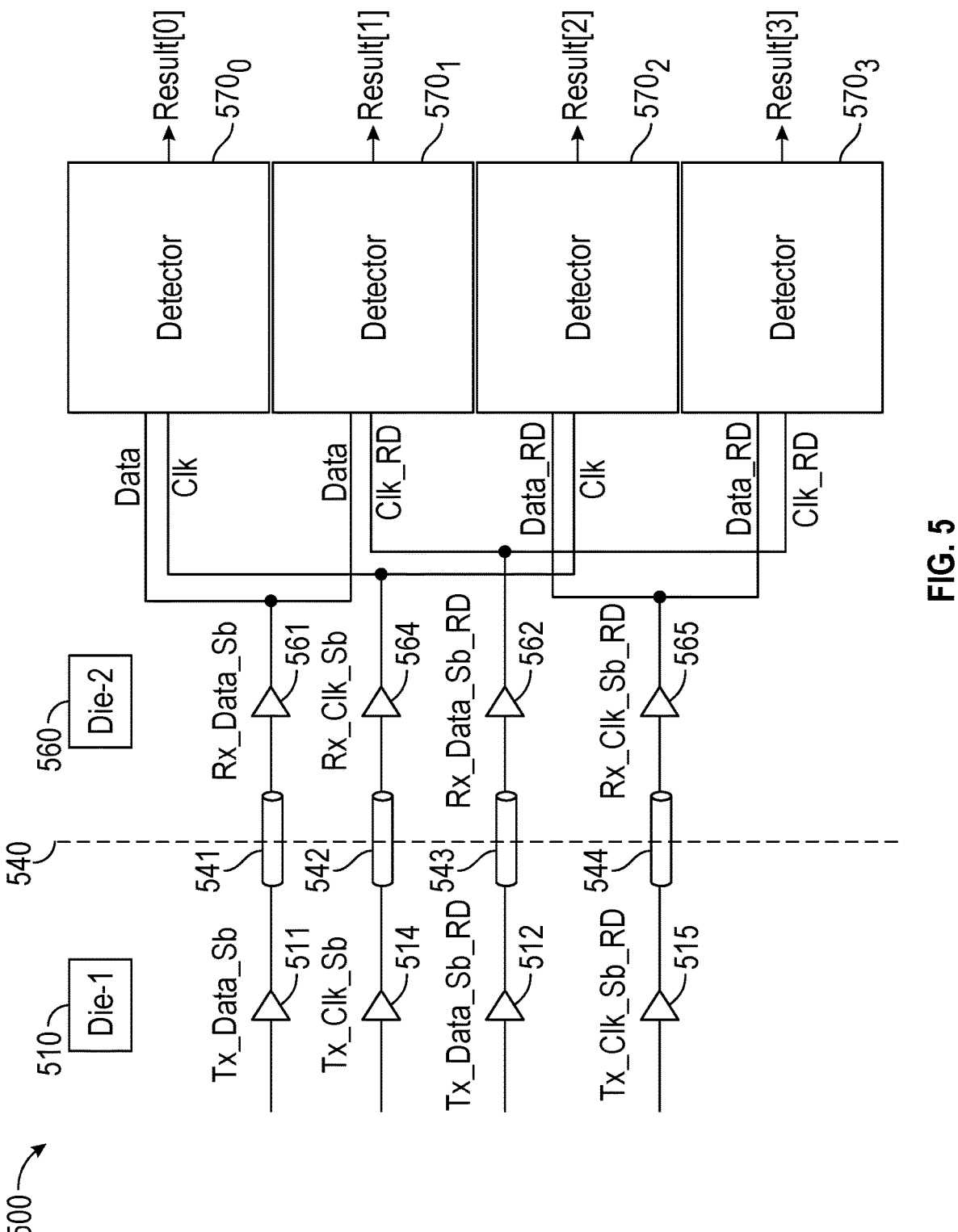
FIG. 5 is a schematic diagram illustrating a die-to-die connection in accordance with an embodiment.

Referring now to FIG. 5, shown is a schematic diagram illustrating a die-to-die connection in accordance with an embodiment. As shown in FIG. 5, a package 500 includes a first die 510 and a second die 560. An interconnect 540, e.g., a UCIe interconnect, includes a plurality of sideband lanes, namely sideband lanes 541-544. Understand while a single direction of sideband lanes is illustrated, corresponding sets of sideband lanes may also be provided for the other direction. First die 510 includes sideband data transmitters and sideband clock transmitters, namely, sideband data transmitters 511, 512 (where sideband data transmitter 512 is a redundant transmitter). First die 510 further includes sideband clock transmitters 514, 515 (where sideband clock transmitter 515 is a redundant transmitter). Second die 560 includes, in turn, sideband data receivers and sideband clock receivers, namely, sideband data receivers 561, 562 (where sideband data receiver 562 is a redundant receiver). Second die 560 further includes sideband clock receivers 564, 565 (where sideband clock receiver 565 is a redundant receiver).

Still referring to FIG. 5, detection circuitry is present in second die 560 that may be used to perform a sideband detection, which may be part of a sideband initialization to determine what lanes are to be included in a functional sideband and what lanes may be part of a redundant sideband. As illustrated, a plurality of detectors $570_{0-3}$ are provided. Each detector 570 receives an incoming sideband data signal and an incoming sideband clock signal such that each detector 570 receives the signals from different combinations of the sideband receivers of second die 560. During sideband initialization, the incoming sideband data signal may be a predetermined sideband initialization packet that includes a predetermined pattern. Detectors 570 may be configured to detect presence of this pattern and generate a first result (e.g., a logic 1) in response to valid detection of the pattern (e.g., for a number of iterations of the pattern) and generate a second result (e.g., a logic 0) in response to no detection of the predetermined pattern. Although embodiments are not limited in this regard, in one implementation detectors 570 may be configured with shift registers, counters and so forth to perform this detection operation and generate the corresponding result by sampling data and redundant data using a clock signal and a redundant clock signal, leading to four combinations.

Note that in cases where redundant sideband circuitry is not used for repair purposes, it may be used to increase bandwidth of sideband communications, particularly for data-intensive transfers. As examples, a sideband in accordance with an embodiment may be used to communicate large amounts of information to be downloaded, such as a firmware and/or fuse download. Or the sideband can be used to communicate management information, such as according to a given management protocol. Note that such communications may occur concurrently with other sideband information communications on the functional sideband.

Figures 6A, 6B:
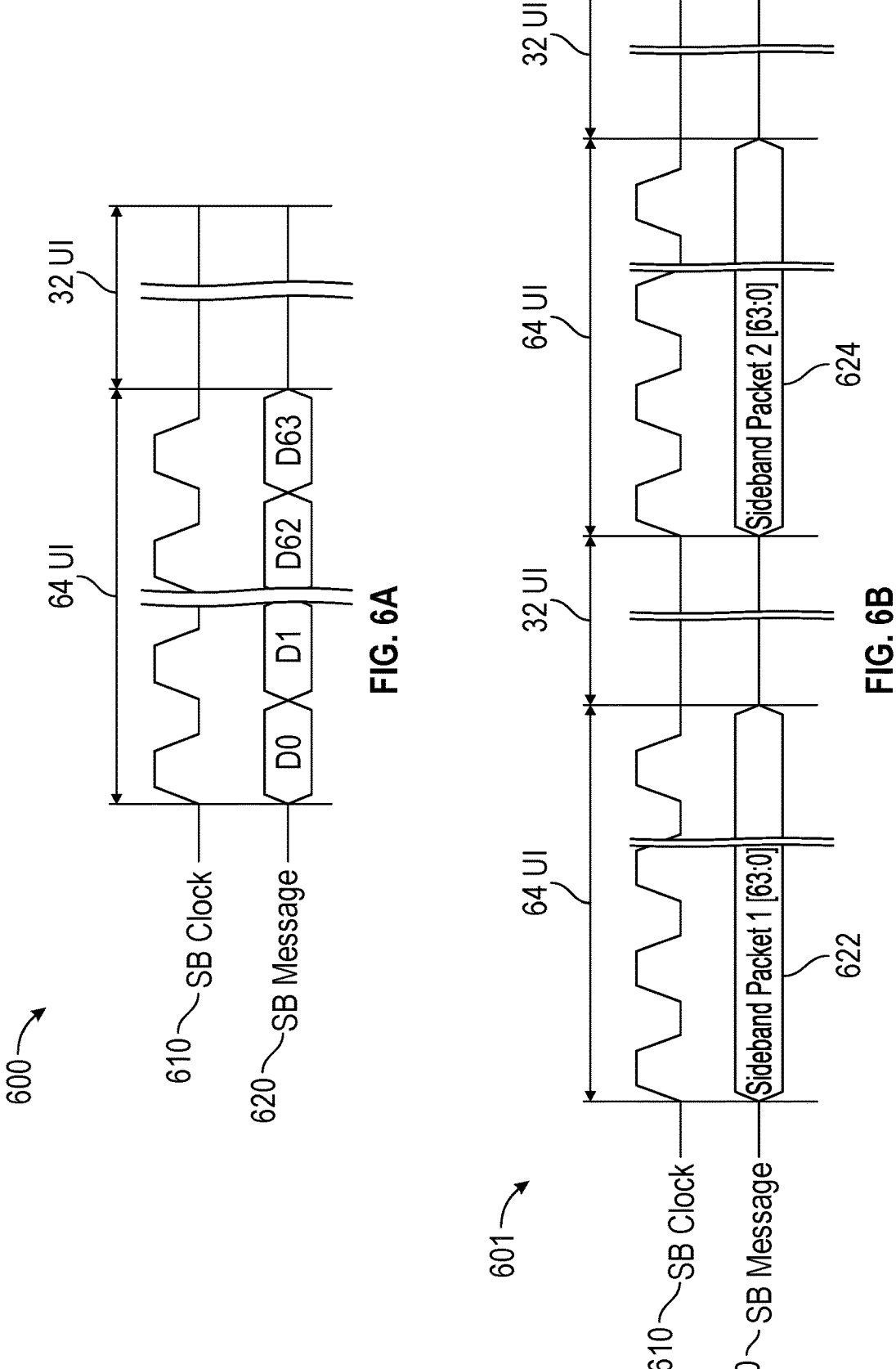
FIGS. 6A/6B are timing diagrams illustrating sideband signaling in accordance with an embodiment.

Referring now to FIG. 6A, shown is a timing diagram illustrating sideband signaling in accordance with an embodiment. As shown in FIG. 6A, timing diagram 600 includes a sideband clock signal 610 and a sideband message signal 620. Sideband message formats may be defined as a 64-bit header with 32 bits or 64 bits of data that are communicated during 64 unit intervals (UIs). Sideband message signal 620 illustrates a 64-bit serial packet. Sideband data may be sent edge aligned with the clock (strobe) signal. A receiver of a sideband interface samples the incoming data with the strobe. For example, the negative edge of the strobe can be used to sample the data as the data uses SDR signaling.

Referring now to FIG. 6B, shown is a timing diagram illustrating sideband packet back-to-back transmission in accordance with an embodiment. As shown in FIG. 6B, timing diagram 601 illustrates communication of a first sideband packet 622 followed by a second sideband packet 624. As shown, each packet may be a 64 bit serial packet that is sent during a 64 UI duration. More specifically, first sideband packet 622 is sent that in turn is followed by a 32 UI duration of logic low on both clock and data lanes, after which second sideband packet 624 is communicated. In embodiments, such signaling may be used for various sideband communications, including sideband messages during a sideband initialization.

Figure 7:
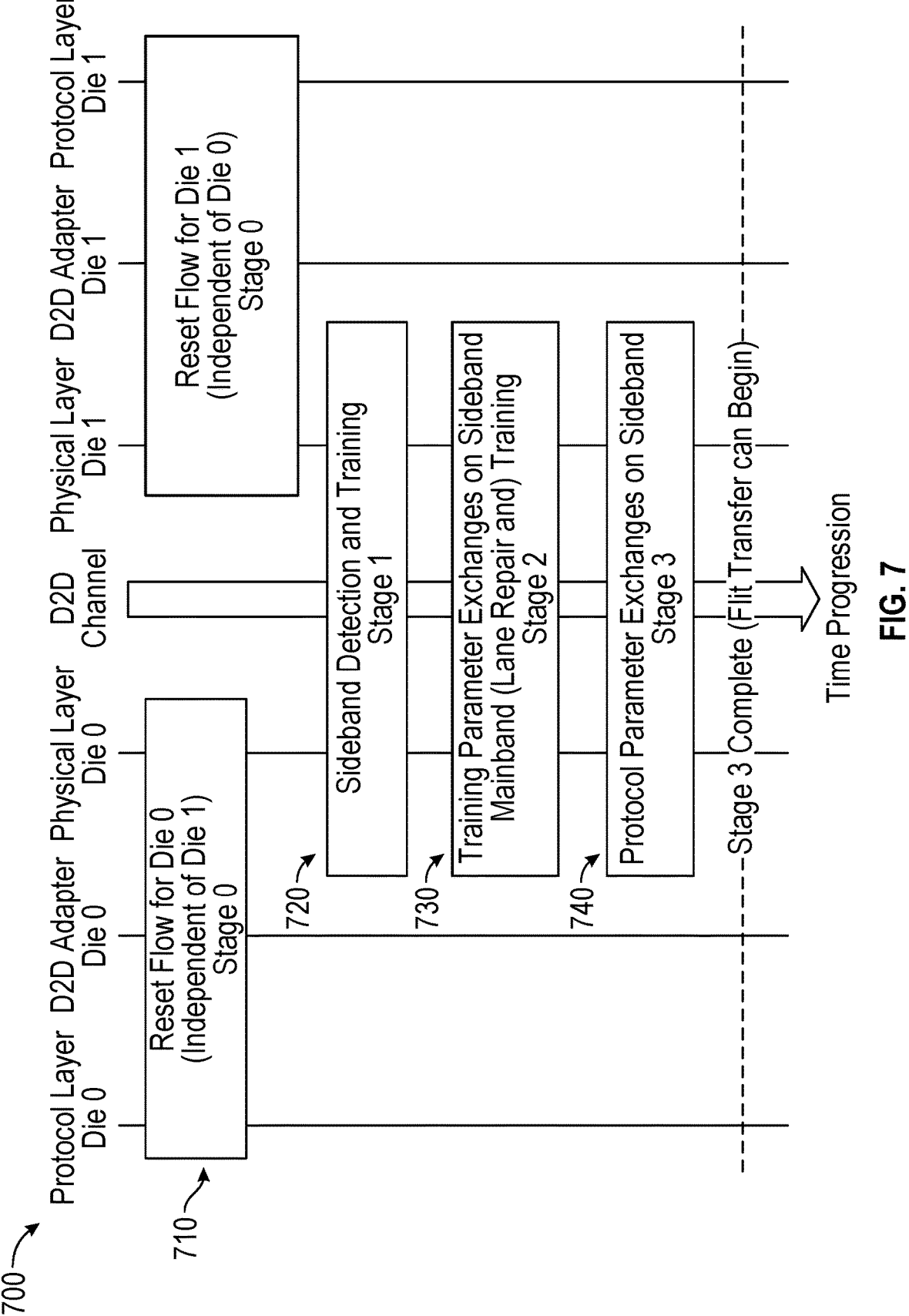
FIG. 7 is a flow diagram illustrating a bring up flow for an on-package multi-protocol capable interconnect in accordance with an embodiment.

Referring now to FIG. 7, shown is a flow diagram illustrating a bring up flow for an on-package multi-protocol capable interconnect in accordance with an embodiment. As shown in FIG. 7, a bring up flow 700 begins by independently performing reset flows on two dies (dies 0 and 1) that are coupled together via, e.g., a UCIe interconnect (illustrated in FIG. 7 as a D2D channel). Thus, a first die (die 0) performs an independent reset flow at stage 710, and a second die (die 1) also performs an independent reset flow at stage 710. Note that each die may exit its reset flow at different times. Next at stage 720 a sideband detection and training may be performed. In stage 720 the sideband may be detected and trained. In the case of an advanced package where lane redundancy is available, available lanes may be detected and used for sideband messages. Note that this sideband detection and training, which includes a sideband initialization as described herein, may be used to detect presence of activity in a coupled die, since as discussed above, each die may exit a reset flow at a different time. In one or more embodiments, a trigger for exiting out of reset and initiating link training is detection of a sideband message pattern. When training during link bring up as when a physical layer transitions out of a reset state, hardware is permitted to attempt training multiple times. During this bring up operation, synchronization may occur as every state and substate entry and exit for both dies is ensured to be in lockstep by a 4-way sideband message handshake between the dies.

At stage 730, training parameter exchanges may be performed on the functional sideband, and a main band training occurs. In stage 730, the main band is initialized, repaired and trained. Finally at stage 740, protocol parameter exchanges may occur on the sideband. In stage 740, the overall link may be initialized by determining local die capabilities, parameter exchanges with the remote die and a bring up of a FDI that couples a corresponding protocol layer with a D2D adapter of the die. In an embodiment, the mainband, by default, initializes at the lowest allowed data rate in the mainband initialization, where repair and reversal detection are performed. The link speed then transitions to a highest common data rate that is detected through the parameter exchange. After link initialization, the physical layer may be enabled to performed protocol flit transfers via the mainband.

In one or more embodiments, different types of packets may be communicated via a sideband interface, and may include: (1) register accesses, which can be Configuration (CFG) or Memory Mapped Reads or Writes and can be 32-bit or 64-bits (b); (2) messages without data, which can be Link Management (LM), or Vendor Defined Packets, and which do not carry additional data payloads; (3) messages with data, which can be Parameter Exchange (PE), Link Training related or Vendor Defined, and carry 64b of data. Packets may carry a 5-bit opcode, 3-bit source identifier (srcid), and a 3-bit destination identifier (dstid). The 5-bit opcode indicates the packet type, as well as whether it carries 32b of data or 64b of data.

Flow control and data integrity sideband packets can be transferred across FDI, RDI or the UCIe sideband link. Each of these have independent flow control. For each transmitter associated with FDI or RDI, a design time parameter of the interface can be used to determine the number of credits advertised by the receiver, with a maximum of 32 credits. Each credit corresponds to 64 bits of header and 64 bits of potentially associated data. Thus, there is only one type of credit for all sideband packets, regardless of how much data they carry. Every transmitter/receiver pair has an independent credit loop. For example, on RDI, credits are advertised from physical layer to adapter for sideband packets transmitted from the adapter to the physical layer; and credits are also advertised from adapter to the physical layer for sideband packets transmitted from the physical layer to the adapter. The transmitter checks for available credits before sending register access requests and messages. The transmitter does not check for credits before sending register access completions, and the receiver guarantees unconditional sinking for any register access completion packets. Messages carrying requests or responses consume a credit on FDI and RDI, but they are guaranteed to make forward progress by the receiver and not be blocked behind register access requests. Both RDI and FDI give a dedicated signal for sideband credit returns across those interfaces. All receivers associated with RDI and FDI check received messages for data or control parity errors, and these errors are mapped to Uncorrectable Internal Errors (UIE) and transition the RDI to the LinkError state.

Figure 8:
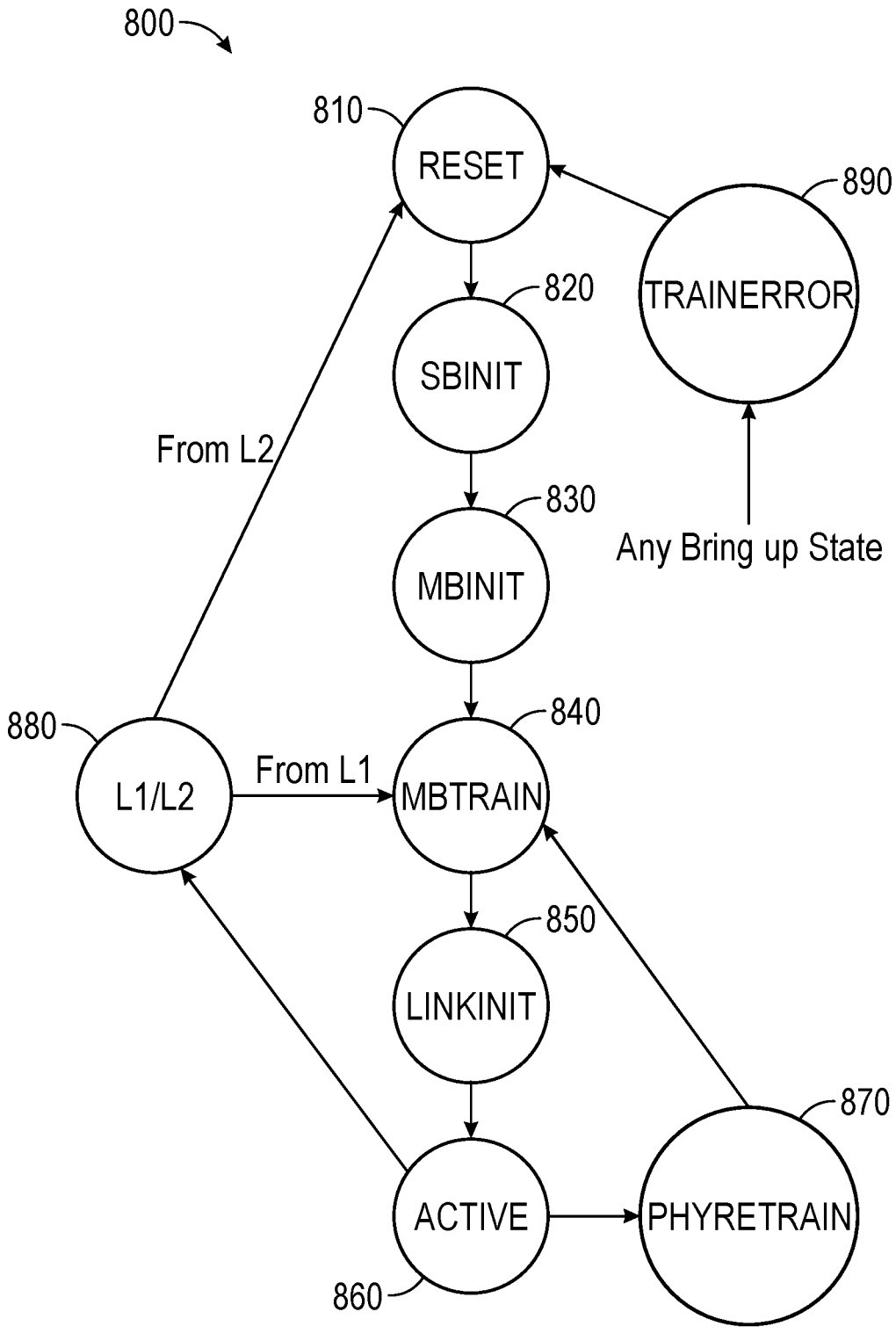
FIG. 8 is a flow diagram of a link training state machine in accordance with an embodiment.

Referring now to FIG. 8, shown is a flow diagram of a link training state machine in accordance with an embodiment. As shown in FIG. 8, method 800 is an example of a link initialization performed, e.g., by logical physical layer circuitry, which may include the link state machine. Table 1 is a high level description of the states of a link training state machine in accordance with an embodiment, and the details and actions performed in each state are described below.

TABLE 1

| STATE | DESCRIPTION |
| --- | --- |
| RESET | This is the state following primary reset or exit from TRAINERROR |
| SBINIT | Side band initialization state where the side band is detected, repaired (when applicable) and out of reset message is transmitted |
| MBINIT | Following sideband initialization, Main band (MB) is initialized at the lowest speed. Both dies perform on die calibration followed by interconnect repair (when applicable) |
| MBTRAIN | Main band (Data, Clock and Valid signals) speed of operation is set to the highest negotiated data rate. Die-to-Die training of main band is performed to center the clock with respect to Data. |
| LINKINIT | This state is used to exchange Adapter and Link management messages |
| ACTIVE | This is the state in which transactions are sent and received |
| PHYRETRAIN | This state is used to begin the retrain flow for the Link during runtime |
| TRAINERROR | State is entered when a fatal or non-fatal event occurs at any point during Link Training or operation. |

With reference to FIG. 8, method 800 begins in a reset state 810. In an embodiment, a PHY stays in the reset state for a predetermined minimum duration (e.g., 4 ms) to allow various circuitry including phase lock loops (PLLs) to stabilize. This state may be exited when power supplies are stable, a sideband clock is available and running, main band and die-to-die adapter clocks are stable and available, a main band clock is set to a slowest IO data rate (e.g., 2 GHz for 4 GT/s), and a link training trigger has occurred. Next control passes to a sideband initialization (SBINIT) state 820, where sideband initialization may be performed. In this state, the sideband interface is initialized and repaired (when applicable). During this state, mainband transmitters may be tri-stated and mainband receivers are permitted to be disabled.

Still with reference to FIG. 8, from sideband initialization state 820, control passes to a main band initialization (MBINIT) state 830 in which a main band initialization is performed. In this state, the main band interface is initialized and repaired or degraded (when applicable). The data rate on the main band may be set to a lowest supported data rate (e.g., 4 GT/s). For an advanced package, interface interconnect repair may be performed. Sub-states in MBINIT allow detection and repair of data, clock, track and valid lanes. For a standard package interface where no lane repair is needed, sub-states are used to check functionality at a lowest data rate and perform width degrade if needed.

Next at block 840, a main band training (MBTRAIN) state 840 is entered in which main band link training may be performed. In this state, operational speed is set up and clock to data centering is performed. At higher speeds, additional calibrations like receiver clock correction, transmit and receive de-skew may be performed in sub-states to ensure link performance. Modules enter each sub-state and exit of each state is through a sideband handshake. If a particular action within a sub-state is not needed, the UCIe Module is permitted to exit it though the sideband handshake without performing the operations of that sub-state. This state may be common for advanced and standard package interfaces, in one or more embodiments.

Control then proceeds to block 850 where a link initialization (LINKINIT) state occurs in which link initialization may be performed. In this state, a die-to-die adapter completes initial link management before entering an active state on a RDI. Once the RDI is in the active state, the PHY clears its copy of a "Start UCIe link training" bit from a link control register. In embodiments, a linear feedback shift register (LFSR) is reset upon entering this state. This state may be common for advanced and standard package interfaces, in one or more embodiments.

Finally, control passes to an active state 860, where communications may occur in normal operation. More specifically, packets from upper layers can be exchanged between the two dies. In one or more embodiments, all data in this state may be scrambled using a scrambler LFSR.

Still with reference to FIG. 8, note that during active state 860 a transition may occur either to a retrain (PHYRETRAIN) state 870 or a low power (L2/L1) link state 880 may occur. As seen, depending upon the level of the low power link state, exit may proceed either to main band training state 840 or reset state 810. In the low power link states, lower power is consumed than dynamic clock gating in an ACTIVE state. This state may be entered when an RDI has transitioned to a power management state. When a local adapter requests an active on the RDI or a remote link partner requests L1 exit, the PHY exits to the MBTRAIN-.SPEEDIDLE state. In one or more embodiments, L1 exit is coordinated with the corresponding L1 state exit transitions on the RDI. When the local adapter requests the active state on RDI or the remote link partner requests L2 exit, the PHY exits to the RESET state. Note that L2 exit may be coordinated with the corresponding L2 state exit transitions on the RDI.

As further shown in FIG. 8, should an error occur during any of the bring up states, control passes to block 890 where a train error state may occur. This state is used as a transitional state due to any fatal or non-fatal events to bring the state machine back to the RESET state. If the sideband is active, a sideband handshake is performed for the link partners to enter TRAINERROR state from any state other than SBINIT.

In an embodiment, a die can enter the PHYRETRAIN state for a number of reasons. The trigger may be by an adapter-directed PHY retrain or a PHY-initiated PHY retrain. A local PHY initiates a retrain on detecting a Valid framing error. A remote die may request PHY retrain, which causes a local PHY to enter PHY retrain on receiving this request. This retrain state also may be entered if a change is detected in a Runtime Link Testing Control register during MBTRAIN.LINKSPEED state. Understand while shown at this high level in the embodiment of FIG. 8, many variations and alternatives are possible.

Figure 9:
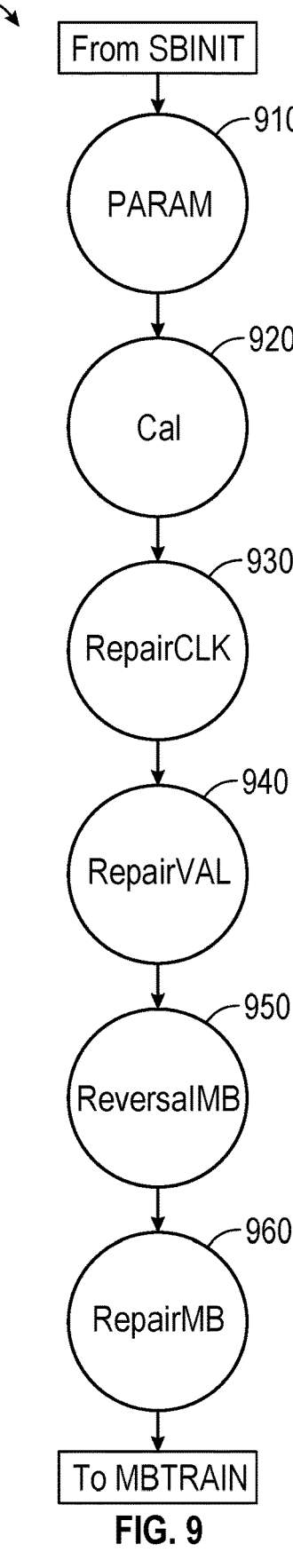
FIG. 9 is a flow diagram of further details of a main band initialization in accordance with an embodiment.

Referring now to FIG. 9, shown is a flow diagram of further details of a main band initialization in accordance with an embodiment. Method 900 may be implemented by the link state machine to perform main band initialization. As shown, this initialization proceeds through a plurality of states, including a parameter exchange state 910, a calibration state 920, a repair clock state 930, a repair validation state 940, a reversal main band state 950, and finally a main band repair state 960. After completion of this main band initialization, control proceeds to main band training.

In parameter exchange state 910, an exchange of parameters may occur to setup the maximum negotiated speed and other PHY settings. In an embodiment, the following parameters may be exchanged with a link partner (e.g., on a per Module basis): voltage swing; maximum data rate; clock mode (e.g., strobe or continuous clock); clock phase; and Module ID. In state 920, any calibration needed (e.g., transmit duty cycle correction, receiver offset and Vref calibration) may be performed.

Next at block 930, detection and repair (if needed) to clock and track Lanes for Advanced Package interface and for functional check of clock and track Lanes for Standard Package interface can occur. At block 940, A Module may set the clock phase at the center of the data UI on its mainband transmitter. The Module partner samples the received Valid with the received forwarded clock. All data lanes can be held at low during this state. This state can be used to detect and apply repair (if needed) to Valid Lane.

Still referring to FIG. 9, block 950 is entered only if clock and valid lanes are functional. In this state, data lane reversal is detected. All transmitters and receivers of a Module are enabled. The Module sets the forwarded clock phase at the center of the data UI on its mainband. The Module partner samples the incoming data with the incoming forwarded clock. A 16-bit "Per Lane ID" pattern (unscrambled) is a lane specific pattern using a Lane ID for the corresponding lane.

Still referring to FIG. 9, at block 960, which is entered only after lane reversal detection and application is successful, all the transmitters and receivers of a Module are enabled. The Module sets the clock phase at the center of the data UI for its mainband. The Module partner samples the incoming data with the incoming forwarded clock on its mainband receivers. In this state, the main band lanes are detected and repaired if needed for Advanced Package interface and for functional check and width degrade for Standard Package interface. Stated another way, if an error is detected in a lane, redundant circuitry can be enabled via a redundant lane.

In example embodiments, several degrade techniques may be used to enable a link to find operational settings, during bring up and operation. First a speed degrade may occur when an error is detected (during initial bring up or functional operation) and repair is not required. Such speed degrade mechanism may cause the link to go to a next lower allowed frequency; this is repeated until a stable link is established. Second a width degrade may occur if repair is not possible (in case of a standard package link where there are no repair resources), the width may be allowed to degrade to a half width configuration, as an example. For example, a 16 lane interface can be configured to operate as an 8 lane interface.

Referring now to FIG. 10, shown is a flow diagram of a main band training in accordance with an embodiment. As shown in FIG. 10, method 1000 may be implemented by the link state machine to perform main band training. In main band training, the main band data rate is set to the highest common data rate for the two connected devices. Data to clock training, deskew and Vref training may be performed using multiple sub states. As shown in FIG. 10, main band training proceeds through a plurality of states or sub-states. As illustrated, main band training begins by performing valid reference voltage training state 1005. In state 1005, a receiver reference voltage (Vref) to sample the incoming Valid is optimized. The data rate on the main band continues to be at the lowest supported data rate. The Module partner sets the forwarded clock phase to the center of the data UI on its main band transmitters. The receiver Module samples the pattern on the Valid signal with the forwarded clock. All data lanes are held low during Valid lane reference voltage training. Control next proceeds to a data reference voltage state 1010, where a receiver reference voltage (Vref) to sample the incoming data is optimized, while the data rate continues to be at the lowest supported data rate (e.g., 4 GT/s). The transmitter sets the forwarded clock phase at the center of the data UI. Thereafter, an idle speed state 1015 occurs where a frequency change may be allowed in this electrical idle state; more specifically, the data rate may be set to the maximum common data rate decided in the previous state. Thereafter, circuit parameters may be updated in transmitter and receiver calibration states (1020 and 1025).

Still referring to FIG. 10, various training states 1030, 1035, 1040 and 1045 may proceed to respectively train valid-to-clock training reference voltage level, full data-to-clock training, and data receiver reference voltages. In state 1030, to ensure the valid signal is functional, valid-to-clock training is performed before data lane training. The receiver samples the pattern on valid with the forwarded clock. In state 1035, the Module may optimize the reference voltage (Vref) to sample the incoming valid at the operating data rate. In state 1040, the Module performs full data to clock training (including valid) using LFSR patterns. In state 1045, the Module may optimize the reference voltage (Vref) on its data receivers to optimize sampling of the incoming data at the operating data rate.

Still with reference to FIG. 10, thereafter a receiver deskew state 1050 may occur, which is a receiver-initiated training step for the receiver to perform lane-to-lane deskew, to improve timing margin. Next another data training state 1055 occurs in which the Module may re-center the clock to aggregate data in case the Module partner's receiver performed a per lane deskew. Control next passes to a link speed state 1060, where link stability at the operating data rate may be checked after the final sampling point is set in state 1055. If the link performance is not met at the data rate, speed is degraded to a next lower supported data rate and training is performed again. Depending upon the result of such state, main band training may conclude, with control next passing to a link initialization. Otherwise, either a link speed change at state 1015 or a repair state 1065 may occur. Note that entry into states 1015 and 1065 also may occur from a low power state (e.g., a L1 link power state) or a retraining state. Understand while shown at this high level in the embodiment of FIG. 10, many variations and alternatives are possible.

In different implementations, different numbers of redundant lanes may be provided. For one example, at the PHY layer, approximately 3-5% redundant lanes can be added to recover a die if some functional lanes are damaged, e.g., during a package chiplet assembly process. Of course, additional or fewer redundant lanes may be present in a given implementation.

Figure 11A:
FIG. 11A is an illustration of data lane remapping possibilities in accordance with an embodiment.

Referring now to FIG. 11A, shown is an illustration of data lane remapping possibilities in accordance with an embodiment. More specifically in FIG. 11A, a portion of a die 1100 is shown with a plurality of data lanes $1110_0$-$1110_{31}$. Data lanes 1110 may be physical transmit data lanes onto which corresponding logical transmit data lanes are mapped. In practical applications, data lanes 1110 may terminate at a series of bumps or other conductors on an external surface of the die to enable direct adaptation to a package substrate or interposer (or directly to another die).

As further shown in FIG. 11A, the arrowed lines represent cross-connection between different data lanes to enable repair and reversal operations as will be described herein.

FIG. 11A is in the context of logical remapping possibility by way of corresponding redundant data lanes $1120_{0,1}$. This remapping may enable a faulty data lane to be remapped to a neighboring lane. Such remapping may occur serially, such that eventually, data of a given data lane is provided to a corresponding redundant data lane. Thus as shown in FIG. 11A, data traffic of data lane $1110_0$ can be remapped to redundant data lane $1120_0$, and similarly, data traffic of data lane $1110_{31}$ can be remapped to redundant data lane $1120_1$.

In one particular embodiment, a module may support remapping (repair) of up to two data lanes for each group of 32 data lanes (e.g., two redundant data lanes for a first set of physical data lanes (e.g., transmit and receive physical data lanes, TD_P[31:0] (RD_P[31:0])) and two redundant data lanes for a second set of physical data lanes (TD_P[63:32] (RD_P[63:32]))). In this way, two separate groups of 32 lanes can be independently repaired using redundant data lanes (TRD_P[1:0](RRD_P[1:0]) and TRD_P[3:2](RRD_P [3:2]), respectively. While in FIG. 11A, there are 2 redundant resources per 32 data lanes for functional data recovery, additional redundant resources may be present in other embodiments. In different embodiments, there may be between approximately 1 and 6 redundant data lanes for a set of 32 data lanes. And understand that a size of a set of data lanes may vary in different implementations, e.g., between 4 and 128, in some cases.

In one or more embodiments, lane remapping can be accomplished by a "shift left" or "shift right" operation. A shift left operation occurs when data traffic of a logical lane TD_L[n] associated with a physical data lane TD_P[n] is multiplexed onto a different physical data lane TD_P[n−1]. A shift right operation occurs when data traffic of a logical data lane TD_L[n] is multiplexed onto a physical data lane TD_P[n+1]. After a data lane is remapped, a physical layer may control a transmitter associated with the broken physical lane to be disabled (e.g., tri-stated) and control a corresponding receiver to be disabled. In turn, the transmitter and receiver of the redundant lane used for the repair are enabled. Both "shift left" and "shift right" remapping may be performed to optimally repair up to any two lanes within a group. Of course additional lanes may be repaired with the presence of additional redundant resources.

In addition to redundant data lane resources, there may be a dedicated redundant clock lane for differential clock circuitry. In one embodiment, clock lane remapping allows repair of a single lane failure for both differential and pseudo-differential implementations of a clock circuit. Similar redundant circuitry also may be provided for a tracking lane.

Figure 11B:
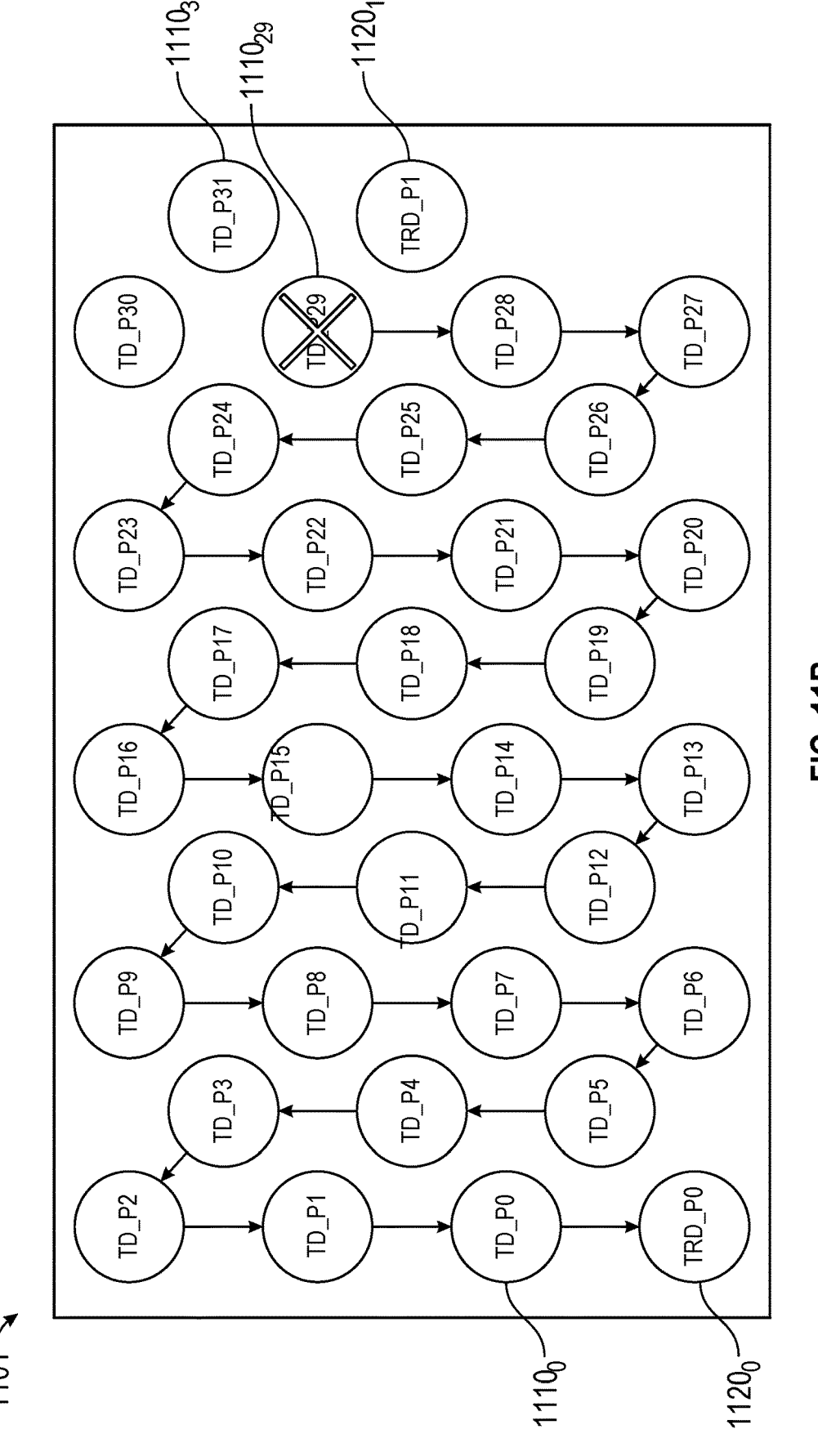
FIG. 11B is a representative remapping configuration for a single lane failure within a module in accordance with an embodiment.

Referring now to FIG. 11B, shown is a representative remapping configuration for a single lane failure. The numbering convention in FIG. 11B follows that of FIG. 11A, although a different die 1101 is shown. As seen, an error in data lane $1110_{29}$ (e.g., this physical lane is broken during assembly) causes a remapping in the direction of redundant data lane $1120_0$, which acts as the repair resource. Following this convention, in the embodiment of FIG. 11B, redundant data lane $1120_0$ (TRD_P[0](RRD_P[0])) is used as the redundant lane to remap any single physical lane failure for TD_P[31:0](RD_P[31:0]), and TRD[2](RRD[2]) is used as the redundant lane to remap any single lane failure for TD_P[63:32] (RD_P[63:32]). Of course, it is equally possible for redundant data lane $1120_1$ to be the repair resource, with the remapping proceeding in the opposite direction. Thus a bidirectional shift mechanism allows forward and backward shifting of any lane data to neighboring lanes, so that a device can support full connectivity or bandwidth.

Referring now to Tables A and B, shown are pseudo code representations of repairs in low order and high order lanes in accordance with an embodiment.

TABLE A

| Pseudo code for lane repair in TD_P[31:0](RD_P[31:0]) (0<= x <=31): |
|---|
| IF failure occurs in TD_P[x]:<br> IF x > 0:<br> FOR 0 <= i < x:<br> TD_P[x−i−1] = TD_L[x−i]<br> RD_L[x−i] = RD_P[x−i−1]<br> TRD_P[0] = TD_L[0]<br> RD_L[0] = RRD_P[0] |

TABLE B

| Pseudo code for lane repair in TD_P[63:32](RD_P[63:32]) (32<= x <=63): |
|---|
| IF failure occurs in TD_P[x]:<br> IF x > 32:<br> FOR 0 <= i < x−32:<br> TD_P[x−i−1] = TD_L[x−i]<br> RD_L[x−i] = RD_P[x−i−1]<br> TRD_P[2] = TD_L[32]<br> RD_L[32] = RRD_P[2] |

Figure 11C:
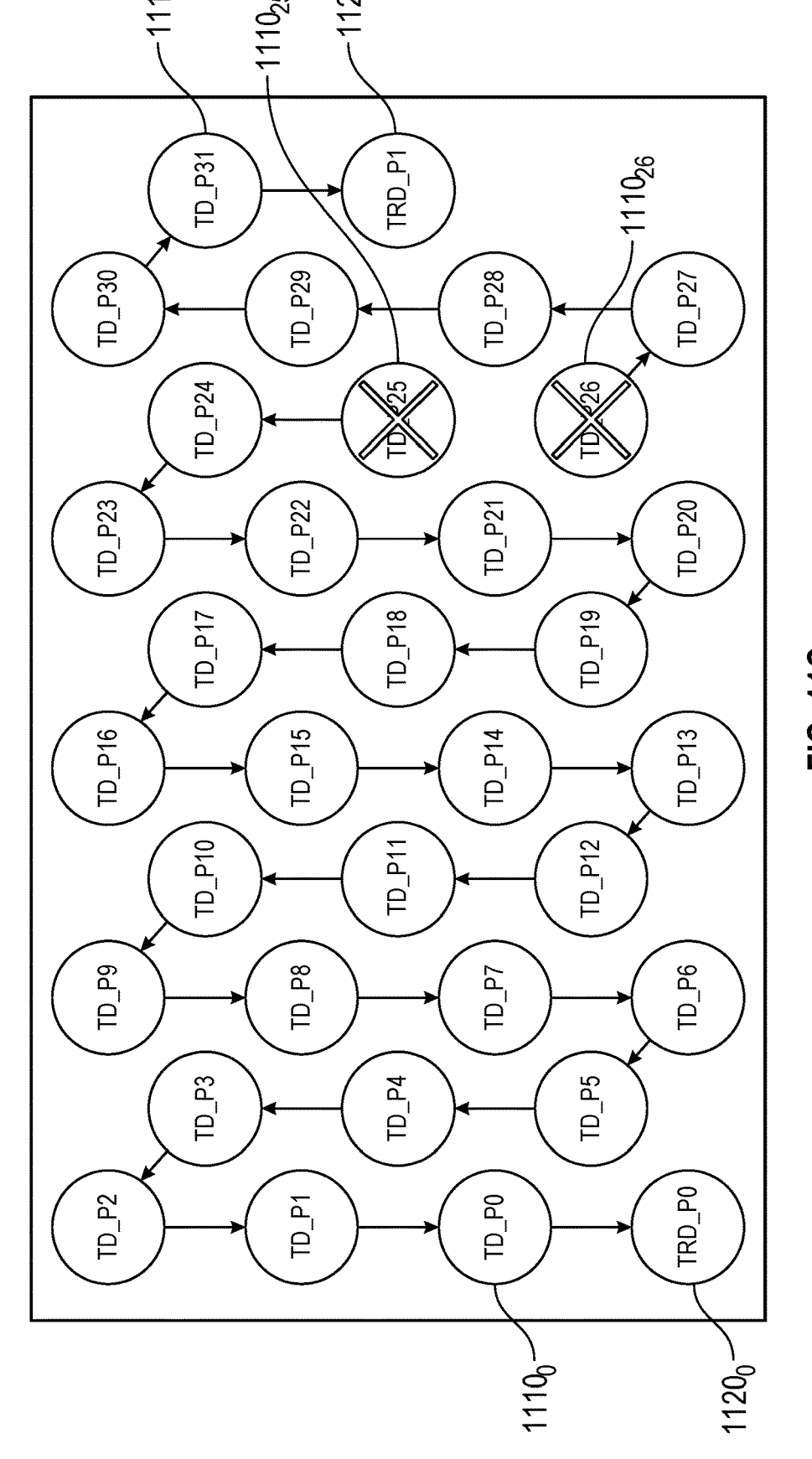
FIG. 11C is a representative remapping configuration for a two lane failure within a module in accordance with an embodiment.

Referring now to FIG. 11C, shown is a representative remapping configuration for a two lane failure within a module. With this arrangement any two lanes within a group of 32 lanes can be repaired using two redundant resources to recover full functional traffic. For example, as shown in FIG. 11C, say physical data lane $1110_{25}$ and $1110_{26}$ are broken. Data is shifted from $1110_{25}$ to $1110_{24}$ and all lanes below are shifted towards redundant lane $1120_0$ (TRD_P0) for this lane repair. For TD26 repair, data is steered into TD27 and all lanes above TD27 shift towards redundant lane 1120 1(TRD_P1). Using the above bidirectional shift scheme, any combination of single or dual lane damage can be fully recovered.

Thus in one embodiment, for any two physical lane failures in TD_P[31:0] (RD_P[31:0]), the lower lane is remapped to TRD_P[0](RRD_P[0]) and the upper lane is remapped to TRD_P[1](RRD_P[1]). For any two physical lane failures in TD_P[63:32] (RD_P[63:31]), the lower lane is remapped to TRD_P[2](RRD_P[2]) and the upper lane is remapped to TRD_P[3](RRD_P[3]).

Referring now to Tables C and D, shown are pseudo code representations for two lane repair in low and high order lanes in accordance with an embodiment. Note that for all the above examples, both transmitter and corresponding receiver apply the indicated remapping.

17

TABLE C

Pseudo code for two lane repair in TD_P[31:0](RD_P[31:0])
(0<= x,y <=31):

```
IF failure occurs in TD_P[x], TD_P[y] AND (x < y):
    IF x > 0:
        FOR 0 <= i < x:
            TD_P[x-i-1] = TD_L[x-i]
            RD_L[x-i] = RD_P[x-i-1]
        TRD_P[0] = TD_L[0]
        RD_L[0] = RRD_P[0]
    IF y < 31:
        FOR 0 <= j < (31-y):
            TD_P[y+j+1] = TD_L[y+j]
            RD_L[y+j]=RD_P[y+j+1]
        TRD_P[1] = TD_L[31]
        RD_L[31]=RRD_P[1]
```

TABLE D

Pseudo code for two lane repair in TD_P[63:32] (RD_P[63:32])
(32<= x,y <=63):

```
IF failure occurs in TD_P[x], TD_P[y] AND (x < y):
    IF x > 32:
        FOR 0 <= i < x-32:
            TD_P[x-i-1] = TD_L[x-i]
            RD_P[x-i-1] TRD_P[2] =
        TD_L[32] = TD_L[32]
        RD_L[32] = RRD_P[2]
    IF y < 63:
        FOR 0 <= j < (63-y):
            TD_P[y+j+1] = TD_L[y+j]
            RD_L[y+j] = RD_P[y+j+1]
        TRD_P[2] = TD_L[63]
        RD_L[63] = RRD_P[2]
```

Figure 12A:
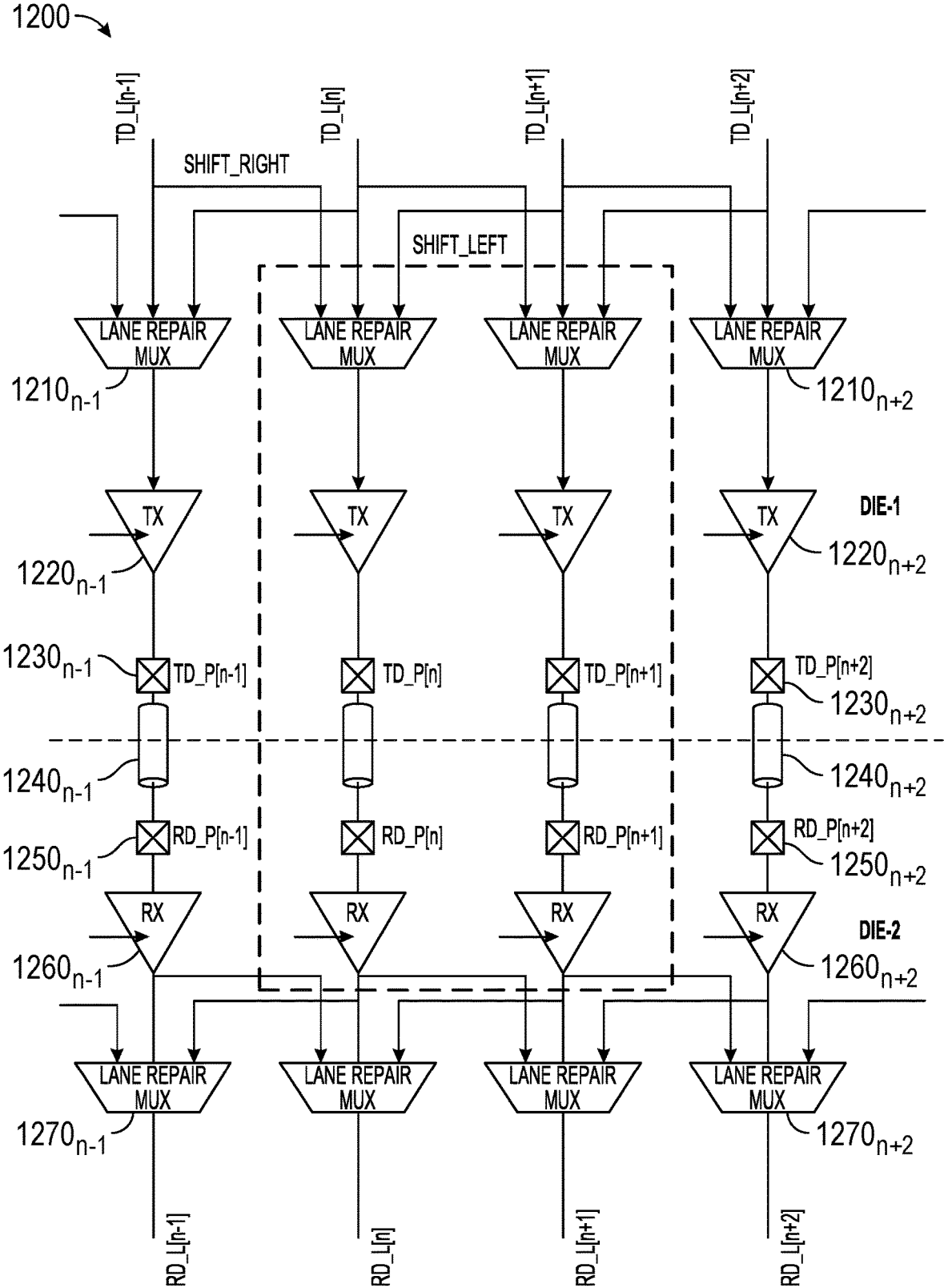
FIG. 12A is a schematic diagram of a portion of a die-to-die connection in accordance with an embodiment

Referring now to FIG. 12A, shown is a schematic diagram of a portion of a die-to-die connection in accordance with an embodiment. As shown in FIG. 12A, a semiconductor package 1200 includes a first die and a second die. The first die includes a plurality of transmit logical data lanes TD_L [n−1, n+2]. Of course, each module or cluster may include more than these illustrated data lanes.

As seen, each data lane provides data to a corresponding lane repair multiplexer $1210_{n-1,\ n+2}$. As further shown, data from adjacent logical data lanes in the left and right directions are provided via shift lines that also couple to multiplexers 1210. When no repair is needed, multiplexer 1210 is controlled to provide data of the corresponding logical data lane to a corresponding one of a plurality of transmitters $1220_{n-1,\ n+2}$ associated with the corresponding physical data lane. Instead when repair is needed, a corresponding left or right shift operation occurs to provide data of an adjacent logical data lane, and multiplexer 1210 is controlled accordingly. Thus multiplexers 1210 may be configured to select corresponding (true) bit lane data {n} or previous bit lane data {n−1} or next bit lane data {n−2}.

Still with reference to FIG. 12A, data output by transmitters 1220 couples through corresponding bumps $1230_{n-1,\ n+2}$ and through interconnects $1240_{n-1,\ n+2}$ into the second die. Proceeding through corresponding bumps $1250_{n-1,\ n+2}$, data is received in receivers $1260_{n-1,\ n+2}$ and from there is provided to corresponding lane repair multiplexers $1270_{n-1,\ n+2}$. As shown, corresponding left and right shift operations are provided to enable remapping operations to occur on a receive side as well. More specifically, the opposite remapping that occurs in the first die transmitter side may occur on the second die receiver side (e.g., if a left shift operation occurs in the first die, a corresponding right shift operation occurs in the second die). Although shown at this high level in FIG. 12A, many variations and alternatives are possible.

Figure 12B:
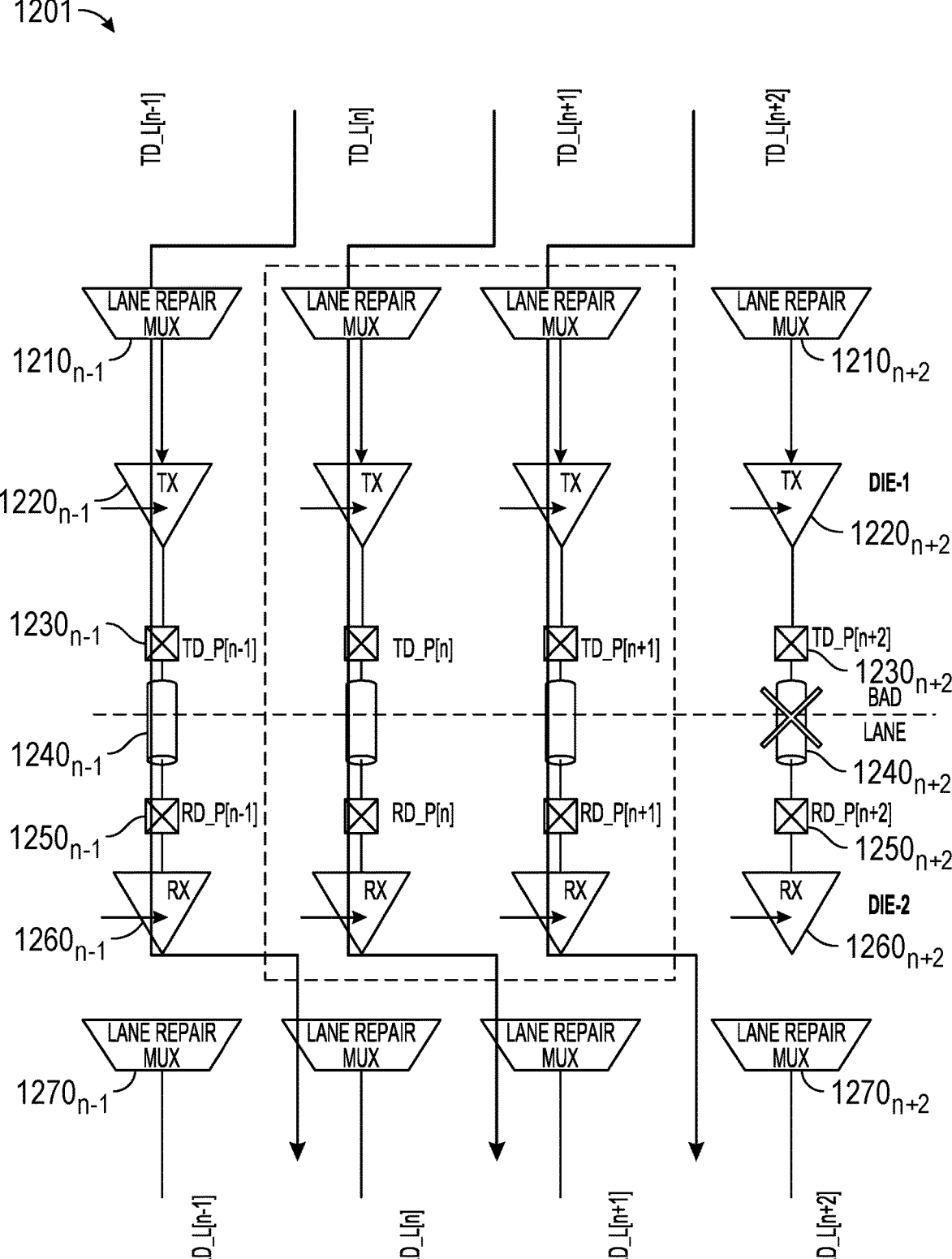
FIG. 12B is a schematic diagram of a portion of a die-to-die connection in accordance with an embodiment illustrating a single lane remapping operation.

Referring now to FIG. 12B, the arrangement of FIG. 12A is shown with a single lane remapping operation in a package 1201 in which a left shift operation occurs on the transmit side to repair a faulty data lane and a corresponding right shift operation occurs on the receive side. Note in this case, only the logical shift operation is shown; understand that the physical circuitry (shown in FIG. 12A) is still present, but not illustrated here to demonstrate the shift operations.

Figure 12C:
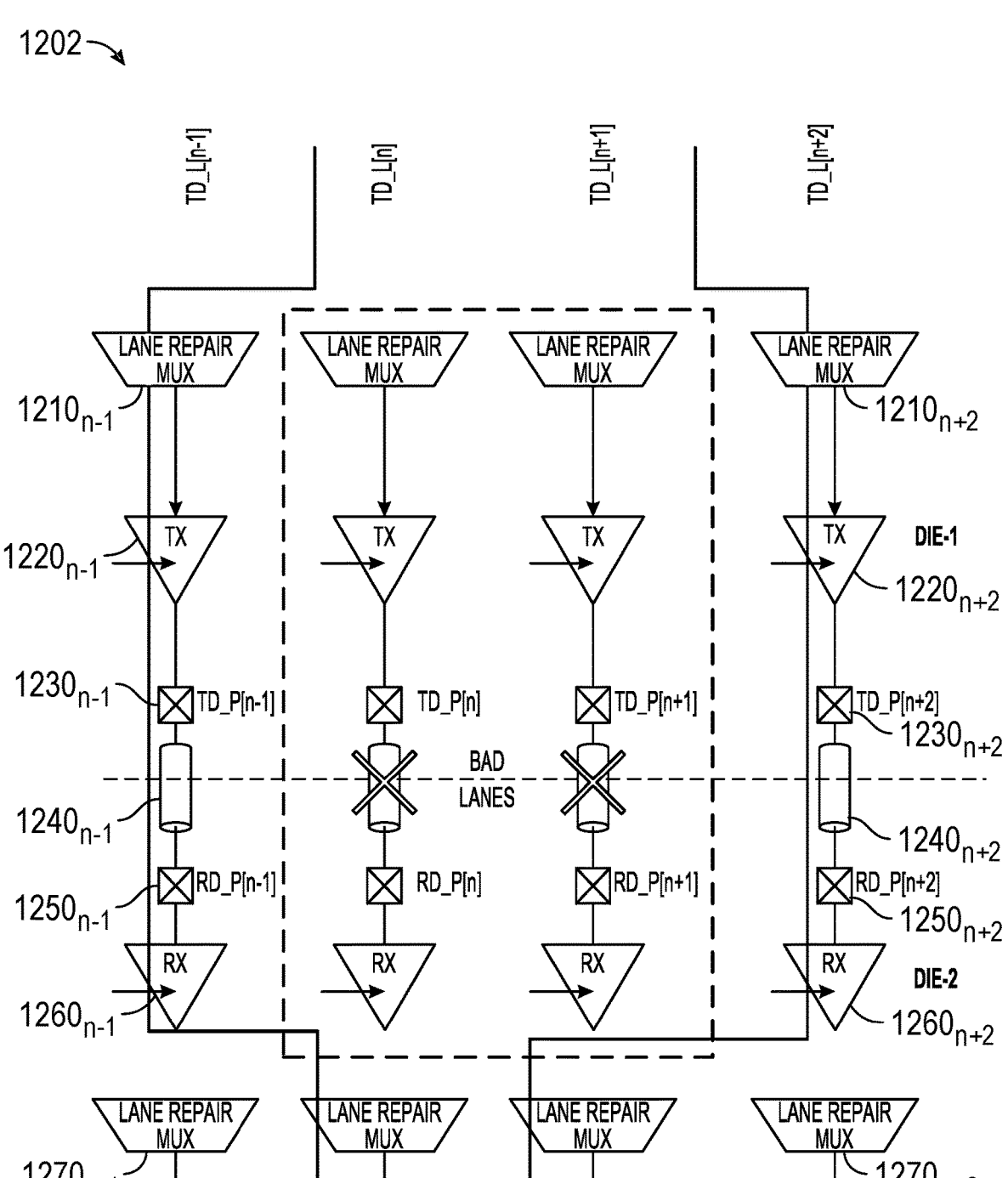
FIG. 12C is a schematic diagram of a portion of a die-to-die connection in accordance with an embodiment illustrating a two lane remapping operation.

Referring now to FIG. 12C, a two lane remapping situation is shown. As seen on the transmit side of a package 1202 both left and right shift operations occur to repair the two bad data lanes and similarly, corresponding opposite right and left shift operations occur on the receive side. As above, FIG. 12C demonstrates the logical shift operation.

In case of a standard package (e.g., x16) Module where lane repair is not supported, resilience against faulty lanes may be provided by configuring the link to a smaller (e.g., x8) width (e.g., logical lanes 0 to 7 or logical lanes 8 to 15, which exclude the faulty lanes). For example, if one or more faulty lanes are in logical lanes 0 to 7, the link is configured to an x8 width using logical lanes 8 to 15. The configuration is done during link initialization or retraining, and transmitters of the disabled lanes may be placed into a high impedance state (hi-Z) and receivers are disabled.

Devices also may be configured to support lane reversal within a Module. An example of lane reversal is when physical data lane 0 on a local die is connected to physical data lane (N−1) on the remote die (physical data lane 1 is connected to physical data lane N−2 and so on), e.g., where N=16 for a standard package and N=64 for an advanced package. Redundant lanes, in case of an advanced package, may also be reversed. In one or more embodiments, lane reversal is implemented on the transmitter only. The transmitter reverses the logical lane order on data and redundant data lanes. In an embodiment, lane reversal is discovered and applied during initialization and training. To enable lane reversal discovery, each logical data and redundant lane within a module is assigned a unique lane ID. Track, valid, clock and sideband signals are not reversed, in some embodiments.

Lane reversal in accordance with an embodiment may use a similar multiplexer structure as described above with respect to FIGS. 12A-12C, except that the multiplexer selects between LSB and MSB bits. Also, lane shift for lane reversal is done at the transmit or receive side only and not on both sides. For example, if lanes are reversed, physical lane 0 of a transmitter (TD_P[0]) is connected to physical lane N−1 of the receiver (RD_P[N−1]) (where N is 64 for advanced package modules and 16 for standard package module). Note that lane repair mapping may change when lane reversal is implemented.

For repair of a single lane with lane reversal, the transmitter side remapping is reversed to preserve shifting order for the receiver side remapping. Referring now to Table E, shown is pseudo code for repairing one lane failure with reversal in TD_P[31:0](RD_P[32:63]) (0<=x<=31).

TABLE E

```
IF failure occurs in TD_P[x]:
    IF x > 0:
        FOR 0 <= i < x:
            TD_P[x-i-1] = TD_L[63-x+i]
            RD_L[63-x+i] = RD_P[63-x+i+1]
```

TABLE E-continued

```
TRD_P[0] = TD_P[63]
RD_P[63] = RRD_P[3]
```

Referring now to Table F, shown is pseudo code for one lane failure with reversal in TD_P[63:32](RD_P[0:31]) (32<=x<=63).

TABLE F

```
IF failure occurs in TD_P[x]:
    IF x > 32:
        FOR 0 <= i < x–32:
            TD_P[x–i–1] = TD_L[63–x+i]
            RD_L[63–x+i] = RD_P[63–x+i+1]
        TRD_P[2] = TD_L[31]
        RD_L[31] = RRD_P[1]
```

For two lane repair with lane reversal, the transmitter side remapping is reversed to preserve shifting order for the receiver side remapping. Referring now to Table G, shown is pseudo code for two lane failure with reversal in TD_P [31:0](RD_P[32:63]) (0<=x<=31).

TABLE G

```
IF failure occurs in TD_P[x], TD_P[y] AND (x < y):
    IF x > 0:
        FOR 0 <= i < x:
            TD_P[x–i–1] = TD_L[63–x+i]
            RD_L[63–x+i] = RD_P[63–x+i+1]
        TRD_P[0] = TD_L[63]
        RD_L[63] = RRD_P[3
    IF y < 31:
        FOR 0 <= j < (31–y):
            TD_P[y+j+1] = TD_L[63–y–j]
            RD_L[63–y–j] = RD_P[63–y–(j+1)]
        TRD_P[1] = TD_L[32]
        RD_L[32] = RRD_P[2]
```

Referring now to Table H, shown is pseudo code for one lane failure with reversal in TD_P[63:32](RD_P[0:31]) (32<=x<=63).

TABLE H

```
IF failure occurs in TD_P[x], TD_P[y] AND (x < y):
    IF x > 32:
        FOR 0 <= i < x–32:
            TD_P[x–i–1] = TD_L[63–x+i]
            RD_L[63–x+i] = RD_P[63–x+(i+1)]
        TRD_P[2] = TD_L[31]
        RD_L[31] = RRD_P[1]
    IF y < 63:
        FOR 0 <= j < (63–y):
            TD_P[y+j+1] = TD_L[63–y–j]
            RD_L[63–y–j] = RD_P[63–y–(j+1)]
        TRD_P[3] = TD_L[0]
        RD_L[0] = RRD_P[0]
```

A mainband repair process may be performed during mainband initialization, in some cases. This process may be performed in a repair state that is entered only after lane reversal detection and application is successful. In this state all transmitters and receivers on a Module are enabled. The Module sets the clock phase to the center of the data UI for the mainband. The link partner samples the incoming data with the incoming forwarded clock on its mainband receivers. In this state, the mainband lanes are detected and repaired if needed for an advanced package interface and for functional check and width degrade for a standard package interface.

In one embodiment the following sequence may be used for mainband repair for an advanced package interface:

1. The Module sends a sideband message {MBINIT.RE-PAIRMB start req} and waits for a response. The link partner responds with {MBINIT.REPAIRMB start resp}.
2. The Module performs transmitter-initiated data-to-clock point training on its transmitter lanes (with a transmit pattern having 128 iterations of a continuous mode "Per Lane ID" Pattern" that is unscrambled). The receiver performs a per lane comparison, and detection on a receiver lane is considered successful if at least a predetermined number (e.g., 16 consecutive iterations) of the "Per Lane ID" pattern are detected.
3. The Module receives the per-lane pass/fail information over a sideband message at the end of the transmitter-initiated data-to-clock point test.
4. If lane repair is required and repair resources are available, the Module applies repair on its mainband transmitters and sends a {MBINIT.REPAIRMB Apply repair req} sideband message. Upon receiving this sideband message, the link partner applies repair on its mainband receivers and sends a {MBINIT.REPAIRMB Apply repair resp} sideband message. If the number of lane failures are more than the repair capability, the mainband is unrepairable and the Module exits to the TRAINERROR state after performing a TRAINER-ROR handshake.
5. If repair is not required, perform step 7.
6. If lane repair is applied (step 4), the applied repair is checked by the Module by repeating steps 2 and 3. If post repair lane errors are logged in step 5, the Module exits to TRAINERROR after performing the TRAIN-ERROR handshake. If repair is successful, step 7 is performed.
7. The Module sends a {MBINIT.REPAIRMB end req} sideband message and the link partner responds with {MBINIT.REPAIRMB end resp}. When the Module has sent and received {MBINIT.REPAIRMB end resp}, it exits to MBTRAIN.

While described in this embodiment with this particular implementation, variations may occur in other embodiments. For example a similar process may be used to perform repair after a retrain or link speed sub-state.

For a standard package interface, the mainband is checked for functional operation at a lowest data rate. The same steps generally as discussed above may occur. However, if an error is identified in a data lane, it is determined whether width degrade is possible. If so, the Module with faulty transmitter lanes applies degrade (to both its transmitter and receiver) and sends a message {MBINIT.REPAIRMB apply degrade req} including a logical lane map to the remote link partner. The link partner applies degrade (to both its trans-mitter and receiver) and sends a message {MBINIT.RE-PAIRMB apply degrade resp}.

In one embodiment, for a standard package interface, if the number of lanes encountering errors are all contained within lanes 0-7 or lanes 8-15, the width is degraded to a x8 Link (Lane 0 . . . Lane 7 or Lane 8 . . . Lane 15)

Figure 13:
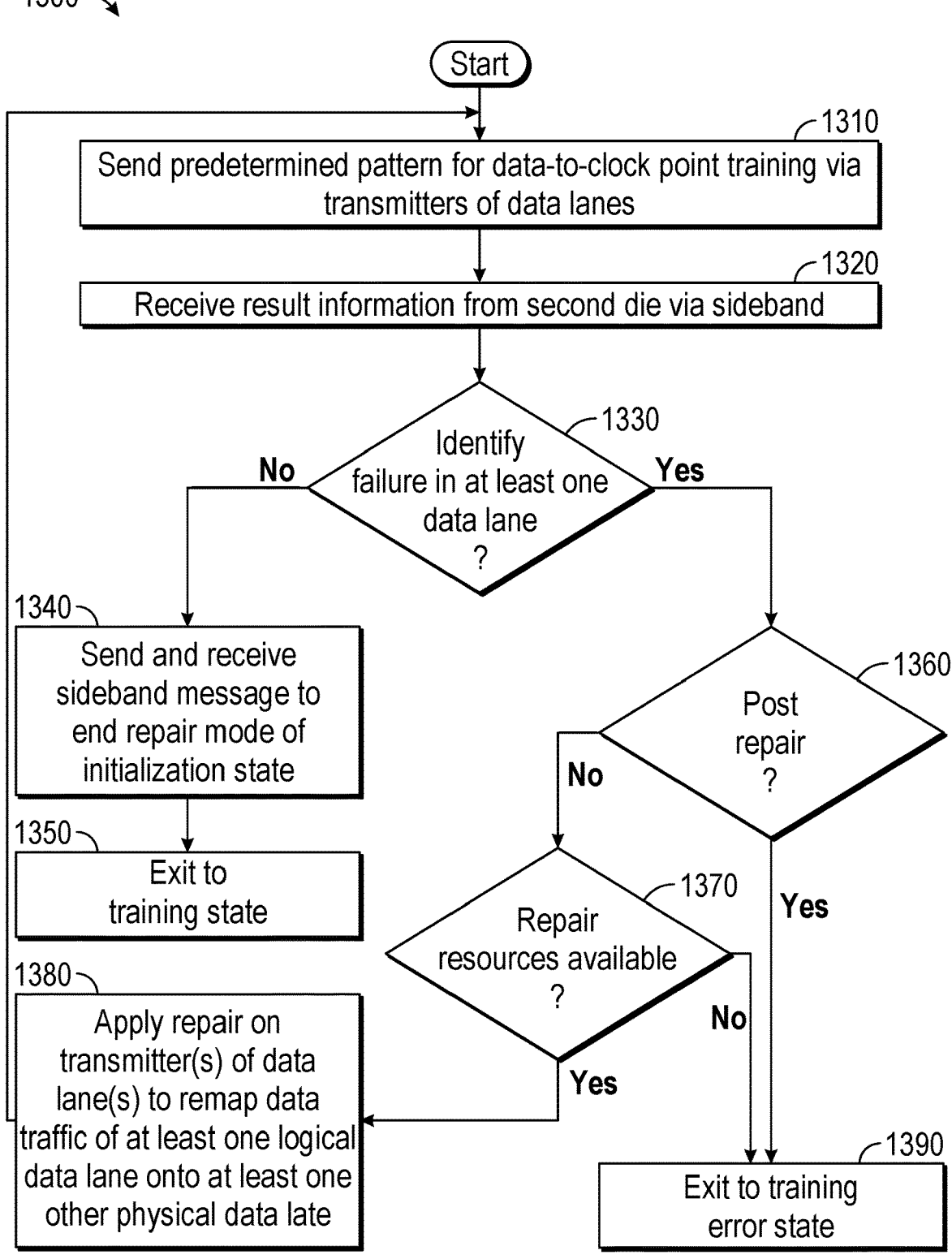
FIG. 13 is a flow diagram of a method in accordance with an embodiment.

Referring now to FIG. 13, shown is a flow diagram of a lane repair method in accordance with an embodiment. As shown in FIG. 13, method 1300 may be performed during initialization of a link. Further, while method 1300 is in the context of a mainband data lane repair, the concepts described here apply equally to other lane repair situations, including clock lanes, sideband lanes and tracking lanes. Method 1300 may be performed at least in part via physical layer circuitry.

As shown in FIG. 13, method 1300 begins by sending a predetermined pattern for data-to-clock point training (block 1310). This predetermined pattern, which may be a per-lane pattern such as a per lane ID pattern, may be sent continuously via a transmitter associated with each physical data lane. For example, 128 iterations of this pattern may be sent. Next at block 1320, result information may be received from the second die via the sideband. This result information may include per-lane pass/fail information.

Still with reference to FIG. 13, next at diamond 1330, it is determined whether at least one data lane failure has been identified. If not, control passes to block 1340 where a repair detection state may be terminated by sending and receiving a sideband message to indicate the termination of the repair state, which is a sub-state of an initialization state of a link training state machine. Thereafter, control passes to block 1350 where this state is exited to the training state.

Still referring to FIG. 13, instead if a failure is identified, control passes to diamond 1350 to determine whether this failure has been identified in a post-repair situation. If so, an error is raised by way of a sideband message, and control passes to block 1390 where this repair sub-state exits to a training error state.

If the failure is an initial failure, control passes to diamond 1370 to determine whether repair resources (e.g., including sufficient redundant lanes to accommodate the number of failing data lanes) are available. If so, control passes to block 1380 for the application of lane repair. More specifically, at block 1380, in a transmit direction, physical layer circuitry may apply repair on one or more transmitters associated with the data lanes to remap data traffic of at least one logical data lane onto at least one other physical lane. Understand that by communication of information regarding the faulty lanes, similar lane repair may occur on the second die, by way of appropriate remapping of receivers so that the correct data traffic is provided to the intended logical data lanes. While shown at this high level in the embodiment of FIG. 13, many variations and alternatives are possible.

Note that in various embodiments, one or more of the features described herein may be configurable to be enabled or disabled, e.g., under dynamic user control, based on information stored in one or more configuration registers (which may be present in one or more of D2D adapter or physical layer, for example). In addition to dynamic (or boot time) enabling or disabling of various features, it is also possible to provide configurability as to operational parameters of certain aspects of UCIe communications.

Embodiments may support two broad usage models. The first is package level integration to deliver power-efficient and cost-effective performance. Components attached at the board level such as memory, accelerators, networking devices, modem, etc. can be integrated at the package level with applicability from hand-held to high-end servers. In such use cases dies from potentially multiple sources may be connected through different packaging options, even on the same package.

The second usage is to provide off-package connectivity using different type of media (e.g., optical, electrical cable, millimeter wave) using UCIe retimers to transport the underlying protocols (e.g., PCIe, CXL) at the rack or pod level for enabling resource pooling, resource sharing, and/or message passing using load-store semantics beyond the node level to the rack/pod level to derive better power-efficient and cost-effective performance at the edge and data centers.

As discussed above, embodiments may be implemented in datacenter use cases, such as in connection with racks or pods. As an example, multiple compute nodes from different compute chassis may connect to a CXL switch. In turn, the CXL switch may connect to multiple CXL accelerators/Type-3 memory devices, which can be placed in one or more separate drawers.

Figure 14:
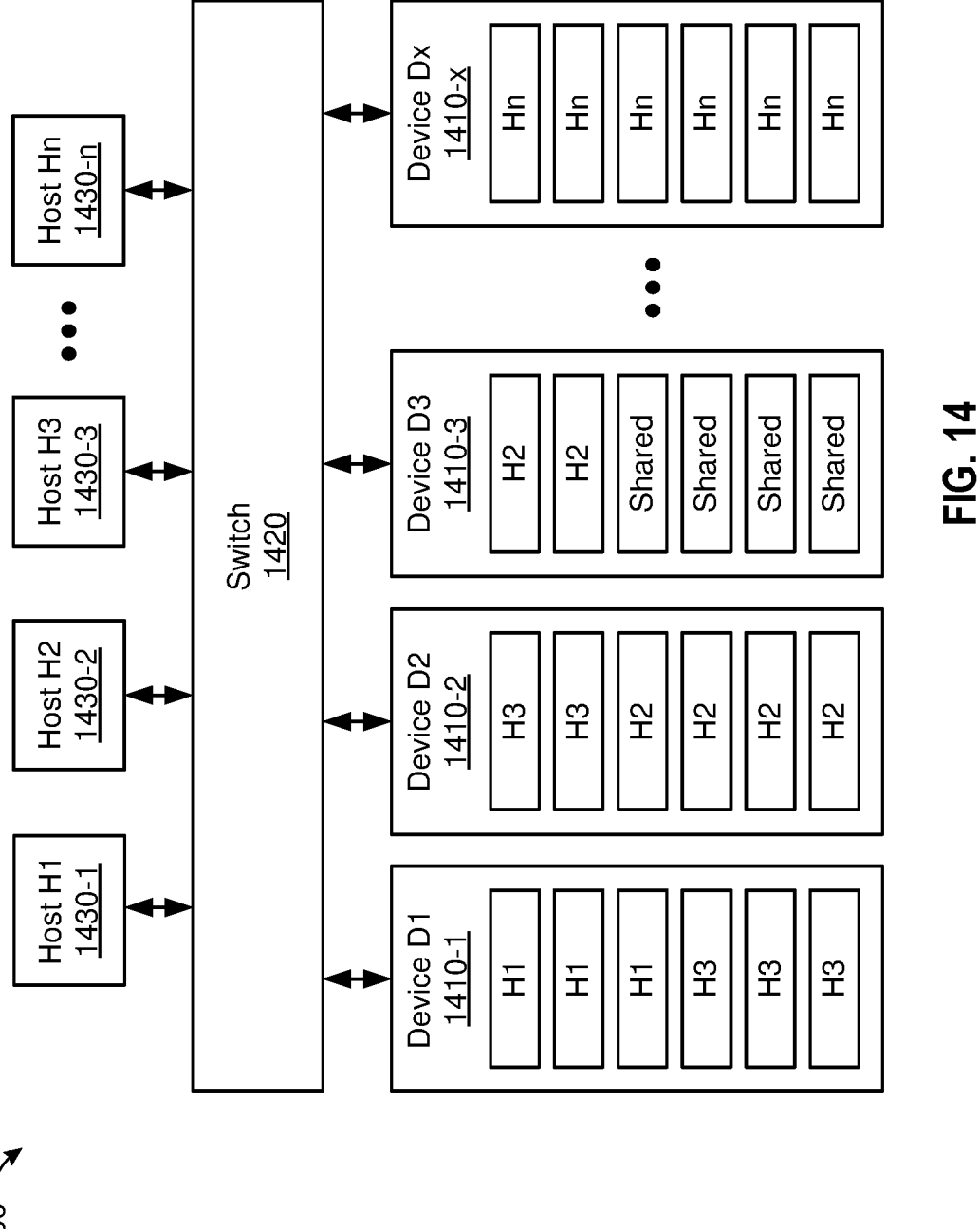
FIG. 14 is a block diagram of another example system in accordance with an embodiment.

Referring now to FIG. 14, shown is a block diagram of another example system in accordance with an embodiment. In FIG. 14, system 1400 may be all or part of a rack-based server having multiple hosts in the form of compute drawers that may couple to pooled memory via one or more switches.

As shown, multiple hosts 1430-1-*n* (also referred to herein as "hosts 1430") are present. Each host may be implemented as a compute drawer having one or more SoCs, memory, storage, interface circuitry and so forth. In one or more embodiments, each host 1430 may include one or more virtual hierarchies corresponding to different cache coherence domains. Hosts 1430 may couple to a switch 1420, which may be implemented as a UCIe or CXL switch (e.g., a CXL 2.0 (or later) switch). In an embodiment, each host 1430 may couple to switch 1420 using an off-package interconnect, e.g., a UCIe interconnect running a CXL protocol through at least one UCIe retimer (which may be present in one or both of hosts 1430 and switch 1420).

Switch 1420 may couple to multiple devices 1410-1-*x* (also referred to herein as "device 1410"), each of which may be a memory device (e.g., a Type 3 CXL memory expansion device) and/or an accelerator. In the illustration of FIG. 14, each device 1410 is shown as Type 3 memory device having any number of memory regions (e.g., defined partitions, memory ranges, etc.). Depending on configuration and use case, certain devices 1410 may include memory regions assigned to particular hosts while others may include at least some memory regions designated as shared memory. Although embodiments are not limited in this regard, the memory included in devices 1410 may be implemented with any type(s) of computer memory (e.g., dynamic random-access memory (DRAM), static random-access memory (SRAM), non-volatile memory (NVM), a combination of DRAM and NVM, etc.).

Figure 15:
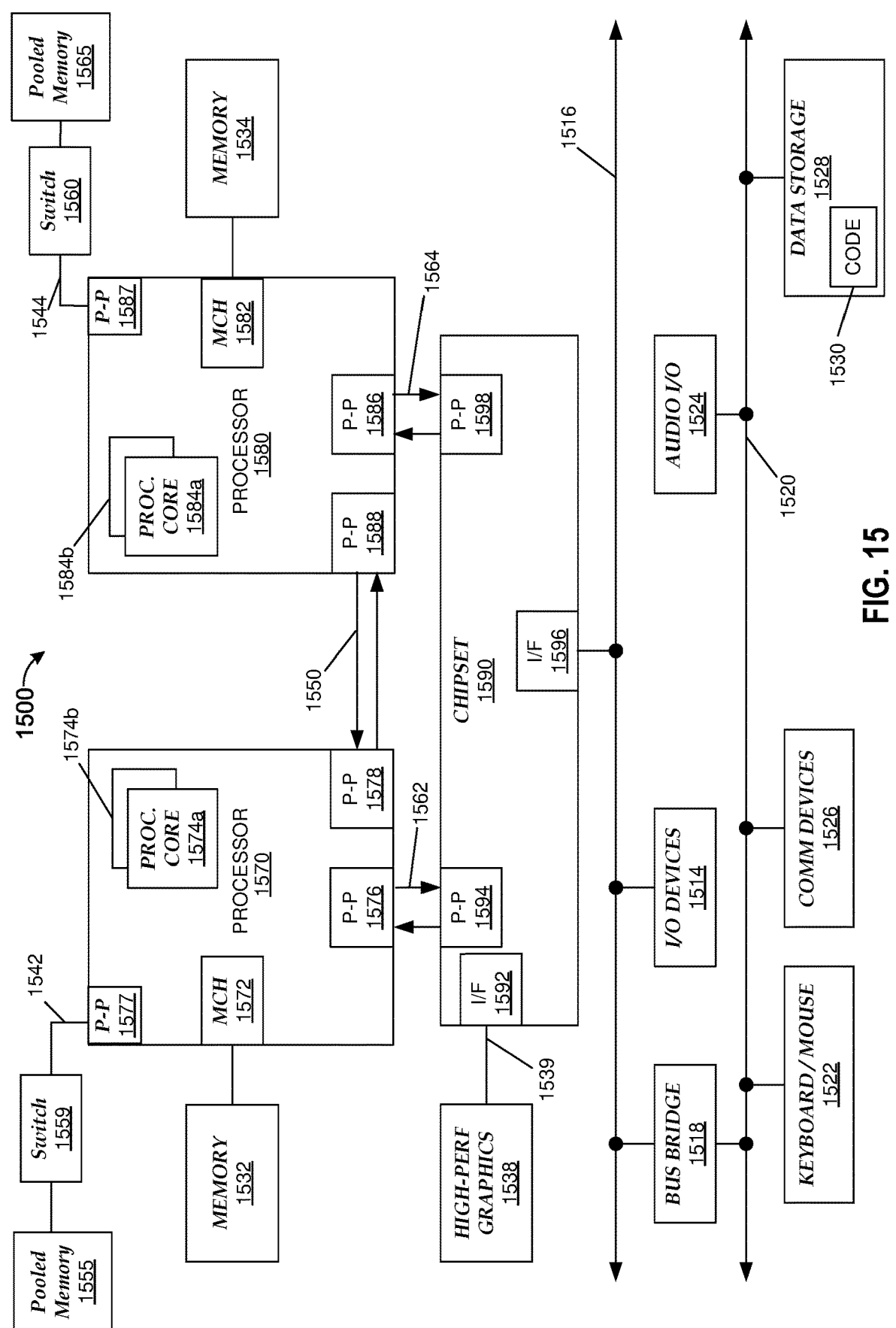
FIG. 15 is a block diagram of a system in accordance with another embodiment such as an edge platform.

Referring now to FIG. 15, shown is a block diagram of a system in accordance with another embodiment such as an edge platform. As shown in FIG. 15, multiprocessor system 1500 includes a first processor 1570 and a second processor 1580 coupled via an interconnect 1550, which can be a UCIe interconnect in accordance with an embodiment running a coherency protocol. As shown in FIG. 15, each of processors 1570 and 1580 may be many core processors including representative first and second processor cores (i.e., processor cores 1574*a* and 1574*b* and processor cores 1584*a* and 1584*b*).

In the embodiment of FIG. 15, processors 1570 and 1580 further include point-to point interconnects 1577 and 1587, which couple via interconnects 1542 and 1544 (which may be UCIe links in accordance with an embodiment) to switches 1559 and 1560. In turn, switches 1559, 1560 couple to pooled memories 1555 and 1565 (e.g., via UCIe links).

Still referring to FIG. 15, first processor 1570 further includes a memory controller hub (MCH) 1572 and point-to-point (P-P) interfaces 1576 and 1578. Similarly, second processor 1580 includes a MCH 1582 and P-P interfaces 1586 and 1588. As shown in FIG. 15, MCH's 1572 and 1582 couple the processors to respective memories, namely a memory 1532 and a memory 1534, which may be portions of system memory (e.g., DRAM) locally attached to the respective processors. First processor 1570 and second processor 1580 may be coupled to a chipset 1590 via P-P interconnects 1576 and 1586, respectively. As shown in FIG. 15, chipset 1590 includes P-P interfaces 1594 and 1598.

Furthermore, chipset 1590 includes an interface 1592 to couple chipset 1590 with a high performance graphics engine 1538, by a P-P interconnect 1539. As shown in FIG. 15, various input/output (I/O) devices 1514 may be coupled to first bus 1516, along with a bus bridge 1518 which couples first bus 1516 to a second bus 1520. Various devices may be coupled to second bus 1520 including, for example, a keyboard/mouse 1522, communication devices 1526 and a data storage unit 1528 such as a disk drive or other mass storage device which may include code 1530, in one embodiment. Further, an audio I/O 1524 may be coupled to second bus 1520.

Figure 16:
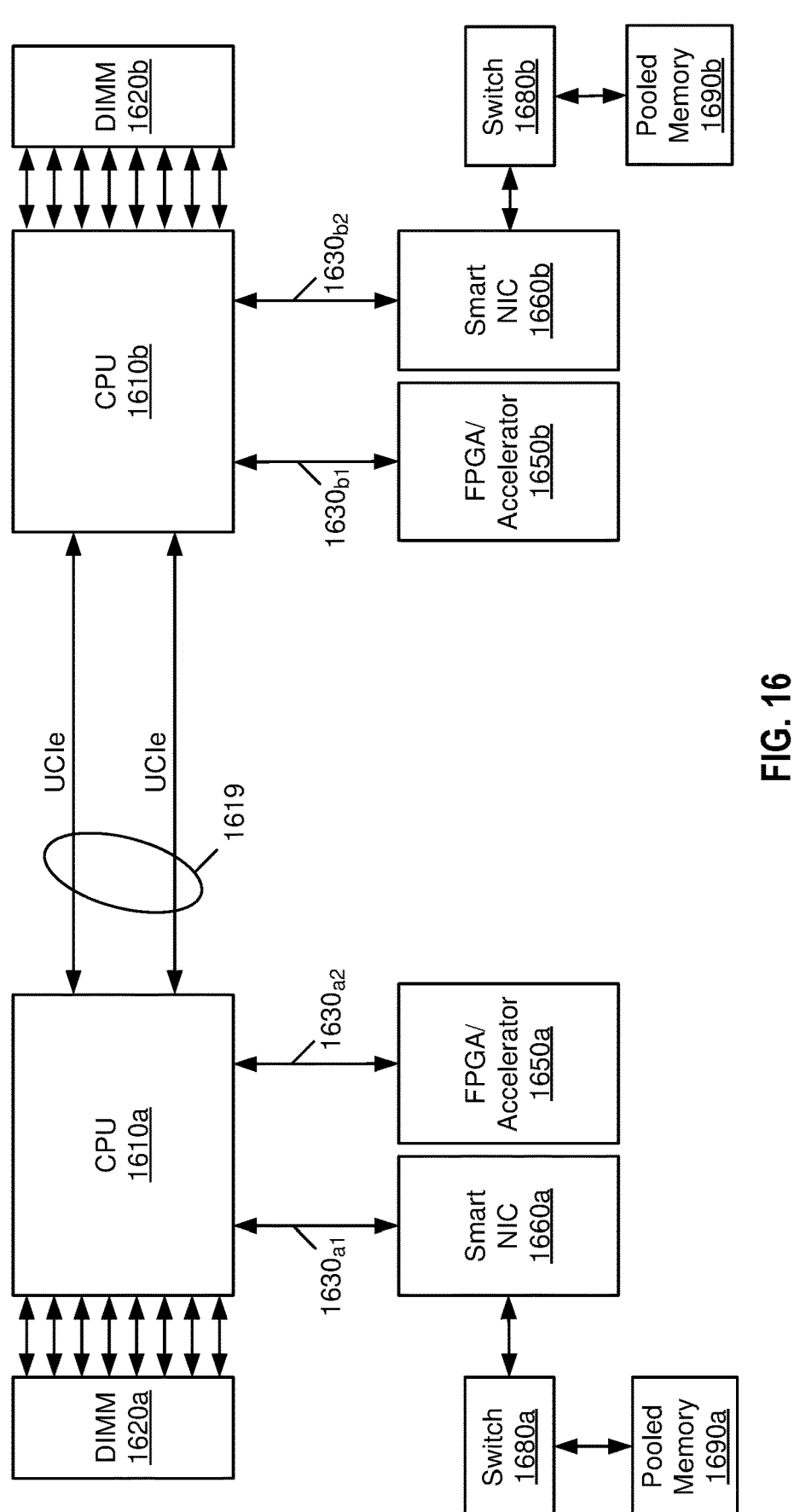
FIG. 16 is a block diagram of a system in accordance with another embodiment.

Referring now to FIG. 16, shown is a block diagram of a system 1600 in accordance with another embodiment. As shown in FIG. 16, system 1600 may be any type of computing device, and in one embodiment may be a server system. In the embodiment of FIG. 16, system 1600 includes multiple CPUs 1610a,b that in turn couple to respective system memories 1620a,b which in embodiments may be implemented as DIMMs such as double data rate (DDR) memory, persistent or other types of memory. Note that CPUs 1610 may couple together via an interconnect system 1615 such as an UCIe or other interconnect implementing a coherency protocol.

To enable coherent accelerator devices and/or smart adapter devices to couple to CPUs 1610 by way of potentially multiple communication protocols, a plurality of interconnects 1630a1-b2 may be present. Each interconnect 1630 may be a given instance of a UCIe link in accordance with an embodiment.

In the embodiment shown, respective CPUs 1610 couple to corresponding field programmable gate arrays (FPGAs)/accelerator devices 1650a,b (which may include GPUs, in one embodiment). In addition CPUs 1610 also couple to smart NIC devices 1660a,b. In turn, smart NIC devices 1660a,b couple to switches 1680a,b (e.g., CXL switches in accordance with an embodiment) that in turn couple to a pooled memory 1690a,b such as a persistent memory. In embodiments, various components shown in FIG. 16 may implement circuitry to perform techniques as described herein.

The following examples pertain to further embodiments.

In one example, an apparatus comprises a first die comprising: a die-to-die adapter to communicate with protocol layer circuitry and physical layer circuitry, where the die-to-die adapter is to receive message information, the message information comprising first information of a first interconnect protocol; and the physical layer circuitry coupled to the die-to-die adapter, where the physical layer circuitry is to receive and output the first information to a second die via an interconnect, where the physical layer circuitry comprises: a first plurality of transmitters to transmit data via a first plurality of data lanes; and at least one redundant transmitter, where the physical layer circuitry is to remap a first data lane of the first plurality of data lanes to the at least one redundant transmitter.

In an example, the apparatus further comprises: a first plurality of bumps adapted on the first die, where the first plurality of bumps are associated with the first plurality of data lanes; and at least one redundant bump adapted on the first die, where the physical layer circuitry is to remap the first data lane from a first bump of the plurality of bumps to the at least one redundant bump.

In an example, the at least one redundant transmitter comprises: a first redundant transmitter, where the physical layer circuitry is to remap the first data lane to the first redundant transmitter to repair a lane failure in the first data lane; and a second redundant transmitter, where the physical layer circuitry is to remap a second data lane of the first plurality of data lanes to the second redundant transmitter to repair a lane failure in the second data lane.

In an example, the physical layer circuitry is to repair 2 data lanes in a group of 32 data lanes via the first redundant transmitter and the second redundant transmitter.

In an example, the apparatus further comprises a first plurality of multiplexers coupled to the first plurality of transmitters, where the physical layer circuitry is to control the first plurality of multiplexers to pass data from one of a corresponding data lane, a first adjacent data lane, or a second adjacent data lane.

In an example, the physical layer circuitry is to: cause a left shift operation to be performed using a first portion of the first plurality of multiplexers to repair a lane failure in a first data lane; and cause a right shift operation to be performed using a second portion of the first plurality of multiplexers to repair a lane failure in a second data lane.

In an example, the apparatus further comprises: a first plurality of receivers to receive second message information via a second plurality of data lanes; and at least one redundant receiver, where in response to a failure in a first data lane of the second plurality of data lanes, the physical layer circuitry is to remap the second data lane of the second plurality of data lanes to the at least one redundant receiver.

In an example, the physical layer circuitry further comprises: a first clock transmitter to transmit a clock signal via a first clock lane; and at least one redundant clock transmitter, where the physical layer circuitry is to remap the first clock lane to the at least one redundant transmitter.

In an example, the physical layer circuitry is to reverse a logical lane order of at least some of the first plurality of data lanes.

In an example, the physical layer circuitry is to reverse the logical lane order when a first data lane associated with a first transmitter of the first plurality of transmitters is coupled to an $N^{th}$ data lane of the second die, where N equals a number of data lanes in a module.

In an example, the physical layer circuitry is to: remap at least one data lane of the first plurality of data lanes in response to a failure in the first data lane, and reverse a logical lane order of at least some of the first plurality of data lanes.

In another example, a method comprises: identifying, via physical layer circuitry of a first die of a package comprising the first die and a second die and an interconnect that couples the first die and the second die, a failure in a first physical data lane of a first plurality of physical data lanes of a mainband of the interconnect, the interconnect comprising the mainband and a sideband; in response to identifying the failure, remapping, via the physical layer circuitry of the first die, first data traffic of a first logical data lane onto a second physical data lane of the mainband; and communicating information regarding the remapping to the second die via the sideband.

In an example, the method further comprises remapping, via physical layer circuitry of the second die, the first data traffic of the first logical data lane from the second physical data lane to the first logical data lane in the second die.

In an example, the method further comprises: identifying, via the physical layer circuitry of the first die, a failure in a clock physical data lane of the interconnect; in response to identifying the failure in the clock physical data lane, remapping, via the physical layer circuitry of the first die, a clock signal from the clock physical data lane to a redundant clock physical data lane; and communicating information regarding the remapping of the clock signal to the second die via the sideband.

In an example, the method further comprises: providing the first data traffic of the first logical data lane to a first multiplexer of the first die; and controlling, via the physical layer circuitry of the first die, the first multiplexer to provide the first data traffic to a second transmitter of the first die associated with the second physical data lane.

In an example, the method further comprises disabling, via the physical layer circuitry, a first transmitter of the first die associated with the first physical data lane.

In another example, a computer readable medium including instructions is to perform the method of any of the above examples.

In a further example, a computer readable medium including data is to be used by at least one machine to fabricate at least one integrated circuit to perform the method of any one of the above examples.

In a still further example, an apparatus comprises means for performing the method of any one of the above examples.

In another example, a package comprises: a first die comprising a CPU and a protocol stack, and a second die coupled to the first die via an interconnect. The first die may include: a die-to-die adapter to communicate with protocol layer circuitry via a FDI and physical layer circuitry via a RDI, where the die-to-die adapter is to communicate message information, the message information comprising first information of a first interconnect protocol; and the physical layer circuitry coupled to the die-to-die adapter via the RDI, where the physical layer circuitry is to receive and output the first information to the second die via the interconnect, where the physical layer circuitry comprises: a first plurality of receivers to receive data via a first plurality of physical data lanes; at least one redundant receiver, wherein the physical layer circuitry is to shift data traffic of a first plurality of physical data lanes to adjacent ones of the first plurality of physical data lanes and at least one redundant lane associated with the at least one redundant receiver, in response to a lane failure in a first physical lane of the first plurality of physical data lanes.

In an example, the physical layer circuitry is to enable at least one redundant transmitter and tri-state a first transmitter of a first plurality of transmitters associated with another physical lane, in response to another lane failure.

In an example, the interconnect comprises a mainband and a sideband, the mainband comprising the first plurality of physical data lanes, and where the physical layer circuitry is to receive information regarding the data traffic shift from the second die via the sideband.

In an example, the second die comprises an accelerator, where the first die is to communicate with the second die according to at least one of a flit mode of a PCIe protocol or a flit mode of a CXL protocol.

In another example, an apparatus comprises: means for identifying a failure in first physical data lane means of a first plurality of physical data lane means of a mainband of an interconnect means coupling a first die means and a second die means, the interconnect means comprising the mainband and a sideband; means for remapping first data traffic of first logical data lane means onto second physical data lane means of the mainband; and means for communicating information regarding the remapping to the second die means via the sideband.

In an example, the apparatus further comprises means for remapping the first data traffic of the first logical data lane means from the second physical data lane means to the first logical data lane means in the second die means.

In an example, the apparatus further comprises: means for identifying a failure in clock physical data lane means of the interconnect means; means for remapping a clock signal from the clock physical data lane means to redundant clock physical data lane means; and means for communicating information regarding the remapping of the clock signal to the second die means via the sideband.

In an example, the apparatus further comprises: means for providing the first data traffic of the first logical data lane means to first multiplexer means of the first die means; and means for controlling the first multiplexer means for providing the first data traffic to second transmitter means of the first die means associated with the second physical data lane means.

In an example, the apparatus further comprises means for disabling first transmitter means of the first die means associated with the first physical data lane means.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SOC or other processor, is to configure the SOC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EE- PROMs), magnetic or optical cards, or any other type of media suitable for storing electronic instructions.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
a first die comprising:
    a die-to-die adapter to communicate with protocol layer circuitry and physical layer circuitry, wherein the die-to-die adapter is to receive message information, the message information comprising first information of a first interconnect protocol; and
    the physical layer circuitry coupled to the die-to-die adapter, wherein the physical layer circuitry is to receive and output the first information to a second die via an interconnect,
    wherein the physical layer circuitry comprises:
        a first plurality of transmitters to transmit data via a first plurality of data lanes; and
        at least one redundant transmitter, wherein the physical layer circuitry is to remap a first data lane of the first plurality of data lanes to the at least one redundant transmitter, wherein the at least one redundant transmitter comprises:
            a first redundant transmitter, wherein the physical layer circuitry is to remap the first data lane to the first redundant transmitter to repair a lane failure in the first data lane; and
            a second redundant transmitter, wherein the physical layer circuitry is to remap a second data lane of the first plurality of data lanes to the second redundant transmitter to repair a lane failure in the second data lane.

2. The apparatus of claim 1, further comprising:
a first plurality of bumps adapted on the first die, wherein the first plurality of bumps are associated with the first plurality of data lanes; and
at least one redundant bump adapted on the first die, wherein the physical layer circuitry is to remap the first data lane from a first bump of the plurality of bumps to the at least one redundant bump.

3. The apparatus of claim 1, wherein the physical layer circuitry is to repair 2 data lanes in a group of 32 data lanes via the first redundant transmitter and the second redundant transmitter.

4. The apparatus of claim 1, further comprising a first plurality of multiplexers coupled to the first plurality of transmitters, wherein the physical layer circuitry is to control the first plurality of multiplexers to pass data from one of a corresponding data lane, a first adjacent data lane, or a second adjacent data lane.

5. The apparatus of claim 4, wherein the physical layer circuitry is to:
cause a left shift operation to be performed using a first portion of the first plurality of multiplexers to repair a lane failure in a first data lane; and
cause a right shift operation to be performed using a second portion of the first plurality of multiplexers to repair a lane failure in a second data lane.

6. The apparatus of claim 1, further comprising:
a first plurality of receivers to receive second message information via a second plurality of data lanes; and at least one redundant receiver, wherein in response to a failure in a first data lane of the second plurality of data lanes, the physical layer circuitry is to remap the second data lane of the second plurality of data lanes to the at least one redundant receiver.

7. The apparatus of claim 1, wherein the physical layer circuitry further comprises:
a first clock transmitter to transmit a clock signal via a first clock lane; and
at least one redundant clock transmitter, wherein the physical layer circuitry is to remap the first clock lane to the at least one redundant transmitter.

8. The apparatus of claim 1, wherein the physical layer circuitry is to reverse a logical lane order of at least some of the first plurality of data lanes.

9. The apparatus of claim 8, wherein the physical layer circuitry is to reverse the logical lane order when a first data lane associated with a first transmitter of the first plurality of transmitters is coupled to an $N^{th}$ data lane of the second die, wherein N equals a number of data lanes in a module.

10. The apparatus of claim 1, wherein the physical layer circuitry is to:
remap at least one data lane of the first plurality of data lanes in response to a failure in the first data lane, and
reverse a logical lane order of at least some of the first plurality of data lanes.

11. A method comprising:
identifying, via physical layer circuitry of a first die of a package comprising the first die and a second die and an interconnect that couples the first die and the second die, a failure in a first physical data lane of a first plurality of physical data lanes of a mainband of the interconnect, the interconnect comprising the mainband and a sideband;
in response to identifying the failure, remapping, via the physical layer circuitry of the first die, first data traffic of a first logical data lane onto a second physical data lane of the mainband;
communicating information regarding the remapping to the second die via the sideband;
providing the first data traffic of the first logical data lane to a first multiplexer of the first die; and
controlling, via the physical layer circuitry of the first die, the first multiplexer to provide the first data traffic to a second transmitter of the first die associated with the second physical data lane.

12. The method of claim 11, further comprising remapping, via physical layer circuitry of the second die, the first data traffic of the first logical data lane from the second physical data lane to the first logical data lane in the second die.

13. The method of claim 11, further comprising:
identifying, via the physical layer circuitry of the first die, a failure in a clock physical data lane of the interconnect;
in response to identifying the failure in the clock physical data lane, remapping, via the physical layer circuitry of the first die, a clock signal from the clock physical data lane to a redundant clock physical data lane; and
communicating information regarding the remapping of the clock signal to the second die via the sideband.

14. The method of claim 11, further comprising disabling, via the physical layer circuitry, a first transmitter of the first die associated with the first physical data lane.

15. A package comprising:
a first die comprising a central processing unit (CPU) and a protocol stack comprising:

a die-to-die adapter to communicate with protocol layer circuitry via a flit-aware die-to-die interface (FDI) and physical layer circuitry via a raw die-to-die interface (RDI), wherein the die-to-die adapter is to communicate message information, the message information comprising first information of a first interconnect protocol; and the physical layer circuitry coupled to the die-to-die adapter via the RDI, wherein the physical layer circuitry is to receive and output the first information to a second die via an interconnect, wherein the physical layer circuitry comprises:

a first plurality of receivers to receive data via a first plurality of physical data lanes; and at least one redundant receiver, wherein the physical layer circuitry is to shift data traffic of a first plurality of physical data lanes to adjacent ones of the first plurality of physical data lanes and at least one redundant lane associated with the at least one redundant receiver, in response to a lane failure in a first physical lane of the first plurality of physical data lanes; and the second die coupled to the first die via the interconnect.

16. The package of claim 15, wherein the physical layer circuitry is to enable at least one redundant transmitter and tri-state a first transmitter of a first plurality of transmitters associated with another physical lane, in response to another lane failure.

17. The package of claim 15, wherein the interconnect comprises a mainband and a sideband, the mainband comprising the first plurality of physical data lanes, and wherein the physical layer circuitry is to receive information regarding the data traffic shift from the second die via the sideband.

18. The package of claim 15, wherein the second die comprises an accelerator, wherein the first die is to communicate with the second die according to at least one of a flit mode of a Peripheral Component Interconnect express (PCIe) protocol or a flit mode of a Compute Express Link (CXL) protocol.

* * * * *